(12) United States Patent
Hong et al.

(10) Patent No.: US 12,199,038 B2
(45) Date of Patent: *Jan. 14, 2025

(54) SEMICONDUCTOR DEVICES AND METHODS OF FABRICATING THE SAME

(71) Applicant: Samsung Electronics Co., Ltd., Suwon-si (KR)

(72) Inventors: Wonhyuk Hong, Seoul (KR); Eui Bok Lee, Seoul (KR); Rakhwan Kim, Suwon-si (KR); Woojin Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 31 days.

This patent is subject to a terminal disclaimer.

(21) Appl. No.: 18/343,784

(22) Filed: Jun. 29, 2023

(65) Prior Publication Data

US 2023/0343707 A1    Oct. 26, 2023

Related U.S. Application Data

(63) Continuation of application No. 17/458,873, filed on Aug. 27, 2021, now Pat. No. 11,728,268.

(30) Foreign Application Priority Data

Jan. 27, 2021  (KR) ........................ 10-2021-0011530

(51) Int. Cl.
*H01L 23/528*    (2006.01)
*H01L 21/768*    (2006.01)
(Continued)

(52) U.S. Cl.
CPC .... *H01L 23/5283* (2013.01); *H01L 21/76816* (2013.01); *H01L 21/76843* (2013.01);
(Continued)

(58) Field of Classification Search
CPC ......... H01L 21/76816; H01L 21/76843; H01L 21/76879; H01L 23/5283; H01L 23/5226; H01L 23/53223; H01L 23/53238; H01L 23/53252; H01L 23/53266; H01L 23/5221; H01L 23/53257; H01L 23/481;
(Continued)

(56) References Cited

U.S. PATENT DOCUMENTS 6,893,957 B2   5/2005   Trivedi et al.
7,514,354 B2   4/2009   Park et al.
(Continued)

*Primary Examiner* — Britt D Hanley
*Assistant Examiner* — Vicki B. Booker
(74) *Attorney, Agent, or Firm* — Myers Bigel, P.A.

(57) ABSTRACT

A semiconductor device includes a transistor on a substrate, a first metal layer that is on the transistor and includes a lower wire electrically connected to the transistor, and a second metal layer on the first metal layer. The second metal layer includes an upper wire that is electrically connected to the lower wire and includes a via structure in a via hole and a line structure in a line trench. The via structure includes a via portion that is in the via hole and is coupled to the lower wire, and a barrier portion that vertically extends from the via portion to cover an inner surface of the line trench. The barrier portion is between the line structure and an insulating layer of the second metal layer. The barrier portion is thicker at its lower level than at its upper level.

20 Claims, 43 Drawing Sheets

(51) Int. Cl.
*H01L 23/522* (2006.01)
*H01L 23/532* (2006.01)

(52) U.S. Cl.
CPC .... *H01L 21/76879* (2013.01); *H01L 23/5226* (2013.01); *H01L 23/53223* (2013.01); *H01L 23/53238* (2013.01); *H01L 23/53252* (2013.01); *H01L 23/53266* (2013.01)

(58) Field of Classification Search
CPC ............ H01L 23/5286; H01L 23/5386; H01L 21/28556; H01L 21/76807; H01L 21/76849; H01L 21/76877; H01L 21/823475; H01L 2221/1063
See application file for complete search history.

(56) References Cited

U.S. PATENT DOCUMENTS

| | | |
|---|---|---|
| 9,728,503 B2 | 8/2017 | Peng et al. |
| 9,773,699 B2 | 9/2017 | Lee et al. |
| 9,786,557 B1 * | 10/2017 | Chi .................... H01L 29/0649 |
| 9,793,212 B2 | 10/2017 | Huang et al. |
| 10,269,698 B1 | 4/2019 | Reznicek et al. |
| 10,580,696 B1 | 3/2020 | Lin et al. |
| 2005/0017361 A1 | 1/2005 | Lin et al. |
| 2005/0023701 A1 | 2/2005 | Kajita et al. |
| 2014/0210087 A1 * | 7/2014 | Kang .................... H01L 23/532 |
| | | 257/774 |
| 2017/0221831 A1 | 8/2017 | Stamper et al. |
| 2018/0350791 A1 * | 12/2018 | Do .................... H01L 23/5223 |
| 2020/0006224 A1 | 1/2020 | Wang et al. |
| 2020/0035546 A1 | 1/2020 | Kuo et al. |
| 2020/0388567 A1 * | 12/2020 | Mignot ............. H01L 21/76877 |

* cited by examiner

SEMICONDUCTOR DEVICES AND METHODS OF FABRICATING THE SAME

CROSS-REFERENCE TO RELATED APPLICATION(S)

The present application is a continuation of and claims priority to U.S. patent application Ser. No. 17/458,873, filed on Aug. 27, 2021, which claims priority under 35 U.S.C. § 119 to Korean Patent Application No. 10-2021-0011530, filed on Jan. 27, 2021, the disclosures of which are hereby incorporated by reference in their entireties.

BACKGROUND

The present disclosure relates to semiconductor devices. A semiconductor device may include an integrated circuit consisting of metal-oxide-semiconductor field-effect transistors (MOS-FETs). To meet increasing demand for a semiconductor device with a small pattern size and a reduced design rule, MOS-FETs are being aggressively scaled down. The scale-down of MOS-FETs may lead to deterioration in operational properties of a semiconductor device. A variety of studies are being conducted to overcome technical limitations associated with the scale-down of semiconductor devices and to realize high-performance semiconductor devices.

SUMMARY

An embodiment of the inventive concept provides a semiconductor device with improved electrical characteristics and a method of fabricating the same.

According to an embodiment of the inventive concept, a semiconductor device may include a transistor on a substrate, a first metal layer on the transistor, the first metal layer including a lower interconnection line electrically connected to the transistor, and a second metal layer on the first metal layer. The second metal layer may include an upper interconnection line electrically connected to the lower interconnection line, and the upper interconnection line may include a via structure in a via hole and a line structure in a line trench. The via structure may include a via portion that is in the via hole and is coupled to the lower interconnection line, and a barrier portion that vertically extends from the via portion to cover an inner surface of the line trench. The barrier portion may be between the line structure and an interlayer insulating layer of the second metal layer. The barrier portion may have a first thickness at its upper level, and the barrier portion may have a second thickness that is larger than the first thickness, at a level adjacent to the via portion.

According to an embodiment of the inventive concept, a semiconductor device may include a transistor on a substrate, a first metal layer on the transistor, the first metal layer including a lower interconnection line electrically connected to the transistor, and a second metal layer on the first metal layer. The second metal layer may include an upper interconnection line electrically connected to the lower interconnection line, and the upper interconnection line may include a via structure in a via hole and a line structure in a line trench. The via structure may include a via portion that is in the via hole and is coupled to the lower interconnection line, and a barrier portion that vertically extends from the via portion to cover an inner surface of the line trench. The barrier portion may be between the line structure and an interlayer insulating layer of the second metal layer, and a nitrogen concentration of the barrier portion may be higher than a nitrogen concentration of the via portion.

According to an embodiment of the inventive concept, a semiconductor device may include a substrate including an active region, a device isolation layer defining active patterns on the active region, the device isolation layer covering a lower side surface of each of the active patterns, an upper portion of each of the active patterns protruding above the device isolation layer, a pair of source/drain patterns in an upper portion of each of the active patterns, a channel pattern between the pair of source/drain patterns, a gate electrode extending in a first direction to cross the channel pattern, gate spacers on opposite side surfaces of the gate electrode and extending in the first direction along with the gate electrode, a gate dielectric layer between the gate electrode and the channel pattern and between the gate electrode and the gate spacers, a gate capping pattern that is on a top surface of the gate electrode and extends in the first direction along with the gate electrode, a first interlayer insulating layer on the gate capping pattern, an active contact that penetrates the first interlayer insulating layer and is electrically connected to at least one of the pair of source/drain patterns, a first metal layer in a second interlayer insulating layer on the first interlayer insulating layer, a second metal layer in a third interlayer insulating layer on the second interlayer insulating layer, and an etch stop layer between the second interlayer insulating layer and the third interlayer insulating layer. The first metal layer may include a lower interconnection line electrically connected to the active contact, and the second metal layer may include an upper interconnection line electrically connected to the lower interconnection line. The upper interconnection line may include a via structure in a via hole and a line structure in a line trench. The via structure may include a via portion that is in the via hole, penetrates the etch stop layer, and is coupled to the lower interconnection line, and a barrier portion that vertically extends from the via portion to cover an inner surface of the line trench. The barrier portion may be between the line structure and the third interlayer insulating layer. The via portion and the barrier portion may include the same metal and may be integrated together as a single object.

According to an embodiment of the inventive concept, a method of fabricating a semiconductor device may include forming a transistor on a substrate, forming a first interlayer insulating layer on the transistor, forming a lower interconnection line that is electrically connected to the transistor, in an upper portion of the first interlayer insulating layer, forming a second interlayer insulating layer on the first interlayer insulating layer, and forming an upper interconnection line in the second interlayer insulating layer. The forming of the upper interconnection line may include patterning an upper portion of the second interlayer insulating layer to form a line trench extending in a specific direction, forming a via hole that vertically extends from the line trench to expose a top surface of the lower interconnection line, selectively depositing a via portion in the via hole, uniformly depositing a barrier portion on the via portion to cover an inner side surface and a bottom surface of the line trench, and forming a line structure on the barrier portion to fill the line trench. The via portion and the barrier portion may include the same metal and may be integrated together as a via structure that is a single object.

DETAILED DESCRIPTION

Figure 1:
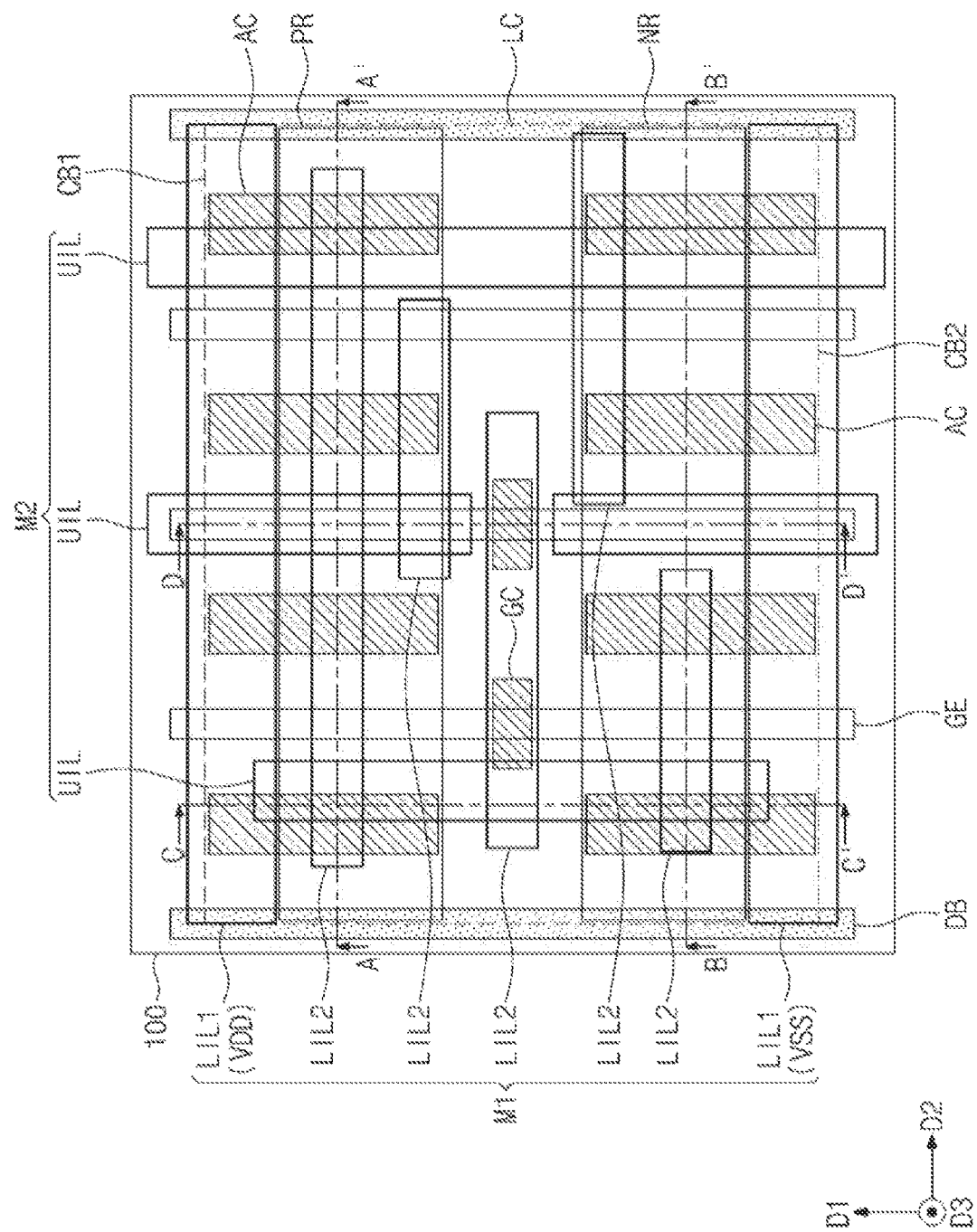
FIG. 1 is a plan view illustrating a semiconductor device according to an embodiment of the inventive concept.
Figure 2A:
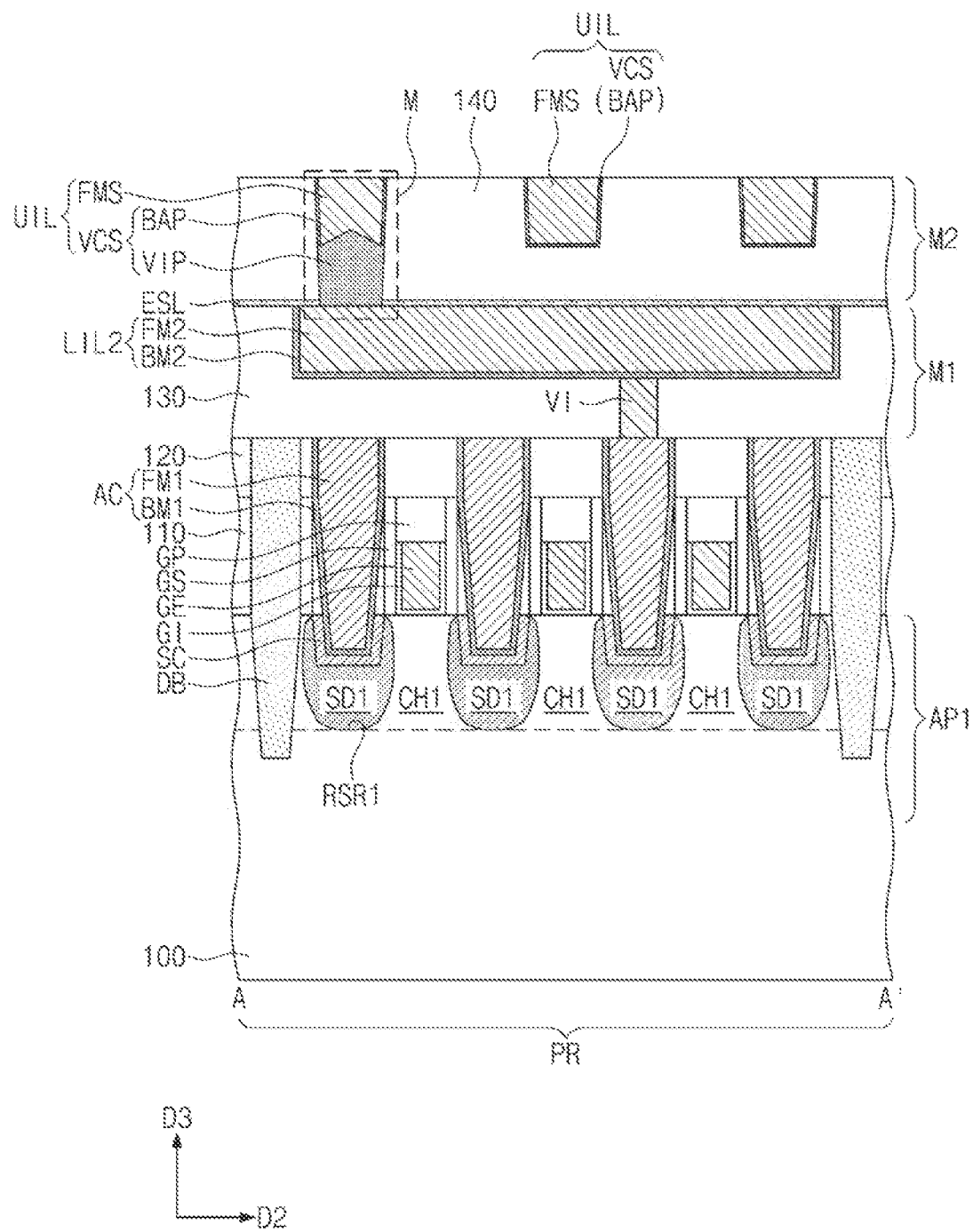
FIGS. 2A to 2D are sectional views, which are respectively taken along lines A-A', B-B', C-C', and D-D' of FIG. 1.
Figure 2B:
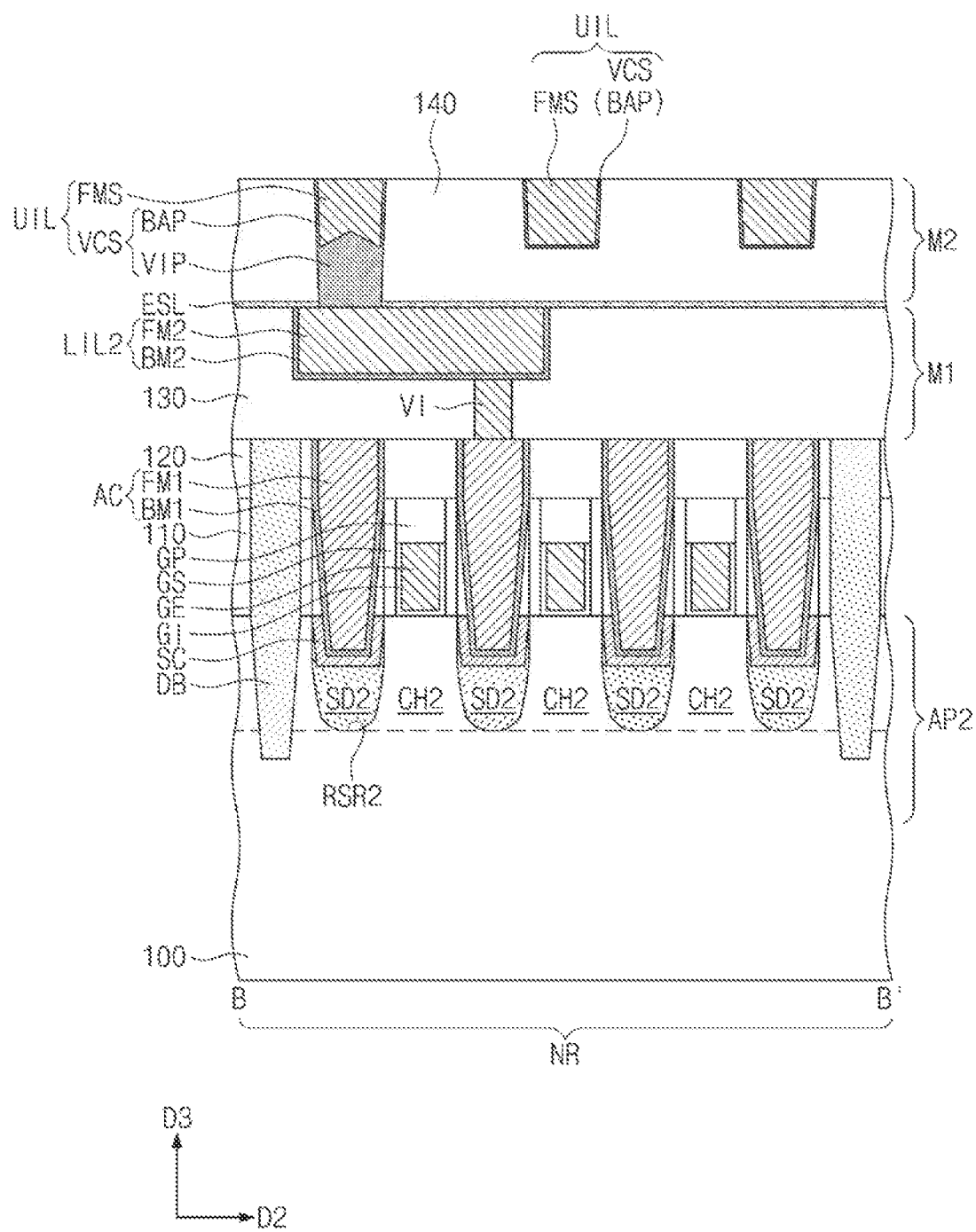
Figure 2C:
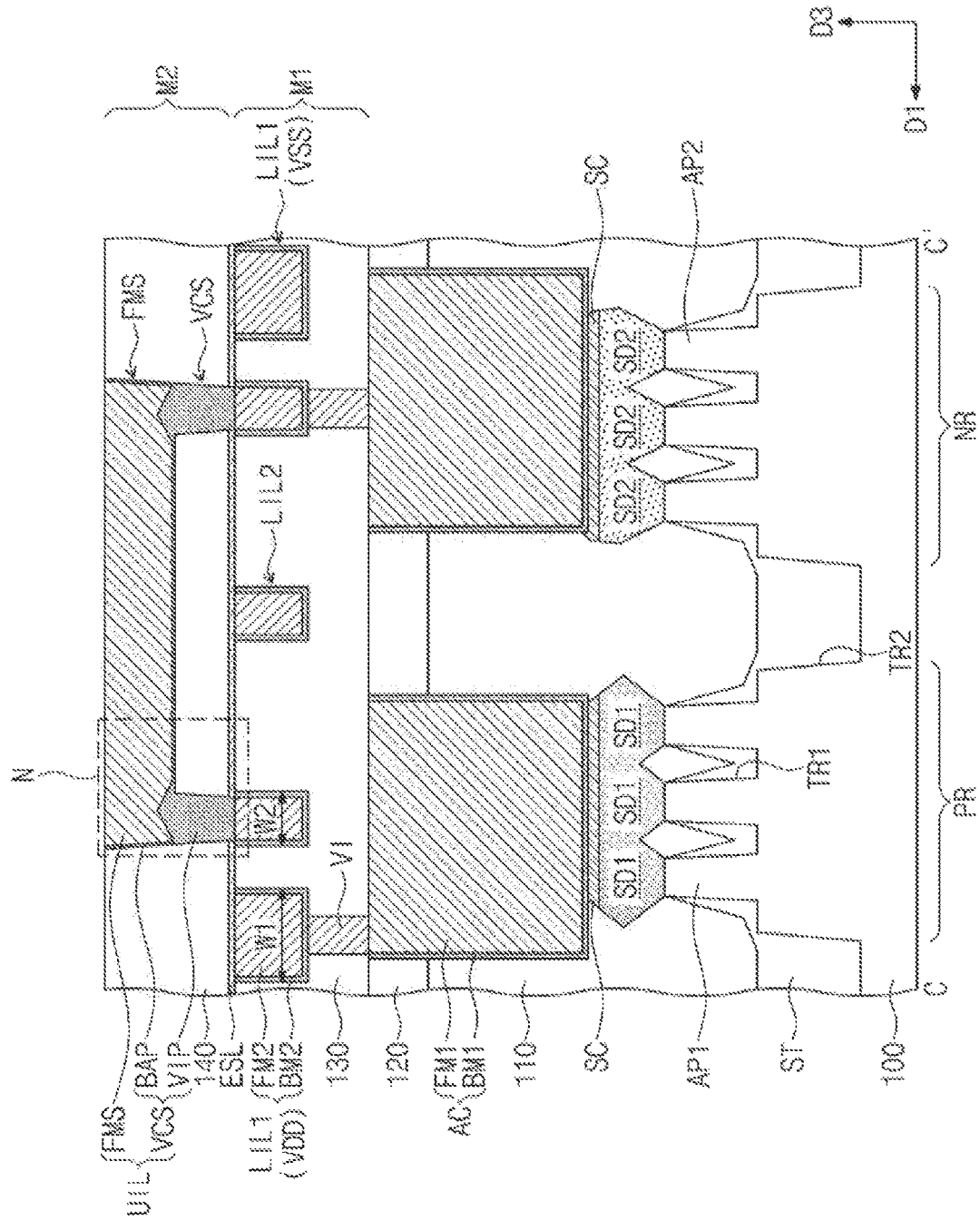
Figure 2D:
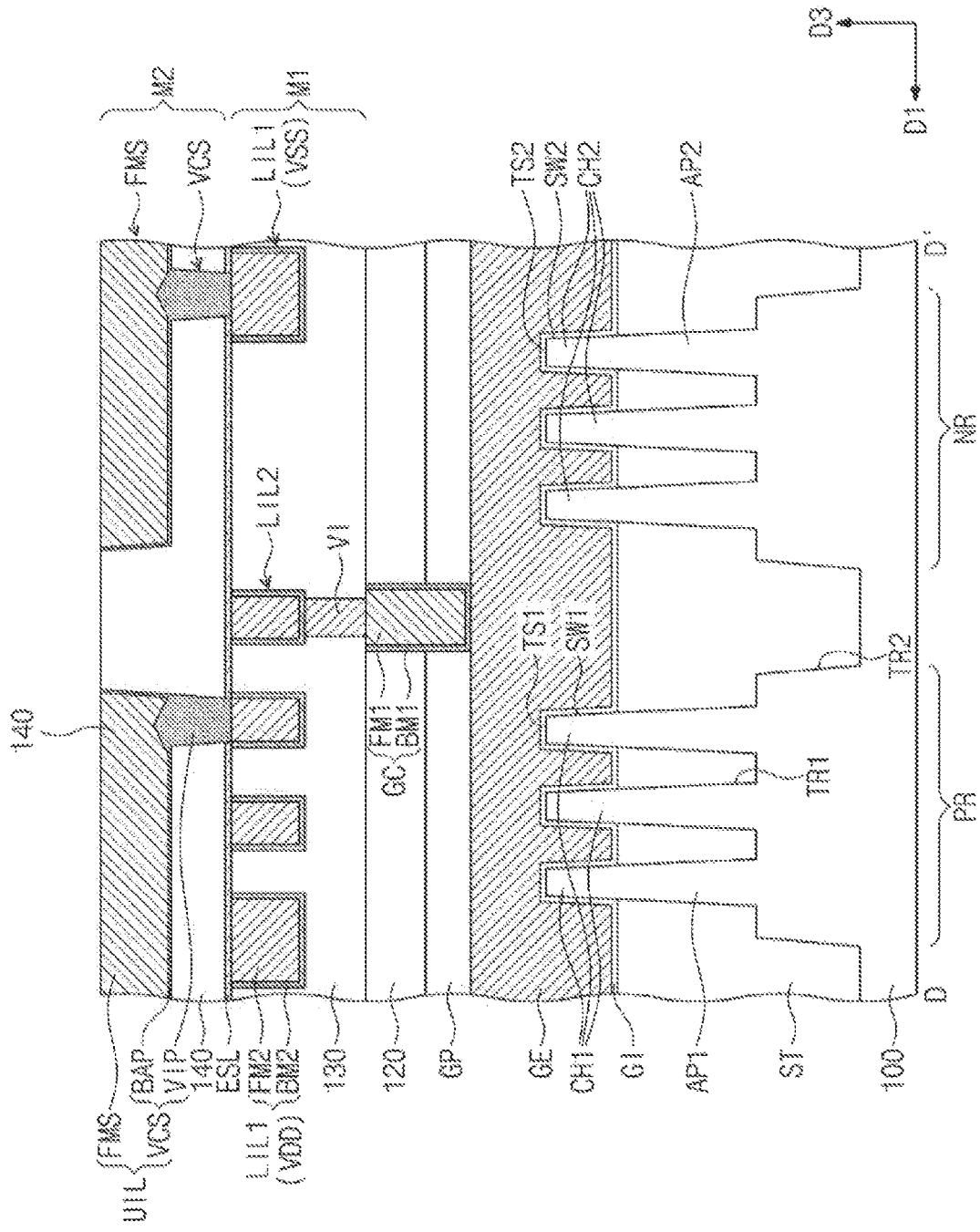
Figure 3:
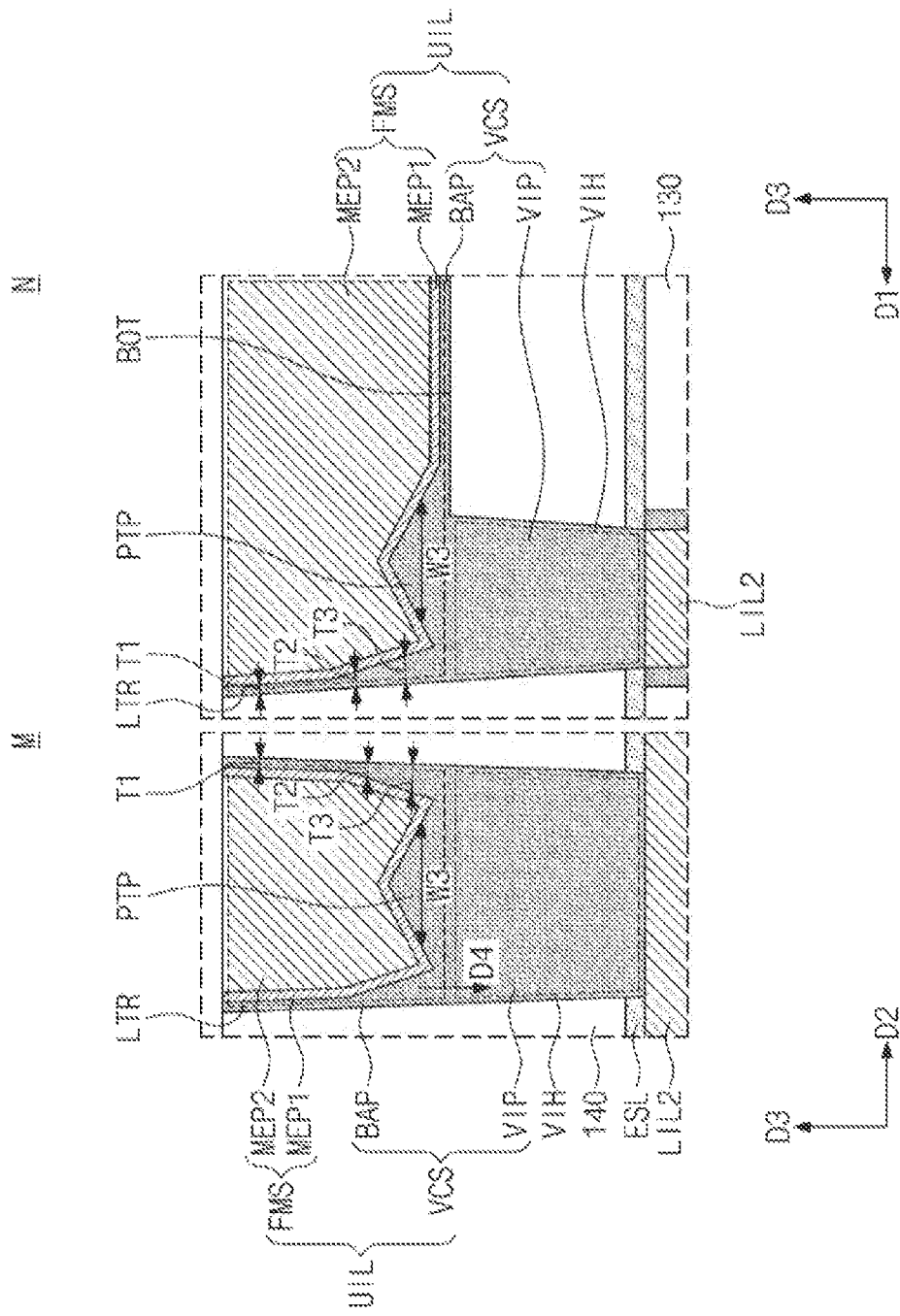
FIG. 3 is an enlarged sectional view illustrating a portion M of FIG. 2A and a portion N of FIG. 2C.

FIG. 1 is a plan view illustrating a semiconductor device according to an embodiment of the inventive concept. FIGS. 2A to 2D are sectional views, which are respectively taken along lines A-A', B-B', C-C', and D-D' of FIG. 1. FIG. 3 is an enlarged sectional view illustrating a portion M of FIG. 2A and a portion N of FIG. 2C.

Referring to FIGS. 1 and 2A to 2D, a logic cell LC may be provided on a substrate 100. In the present specification, the logic cell LC may mean a logic device (e.g., an inverter, a flip-flop, and so forth), which is configured to execute a specific function. For example, the logic cell LC may include transistors constituting the logic device and interconnection lines connecting the transistors to each other.

The substrate 100 may include a first active region PR and a second active region NR. In an embodiment, the first active region PR may be a PMOSFET region, and the second active region NR may be an NMOSFET region. The substrate 100 may be a semiconductor substrate that is formed of or includes silicon, germanium, silicon-germanium, a compound semiconductor material, or the like. In an embodiment, the substrate 100 may be a silicon wafer.

The first and second active regions PR and NR may be defined by a second trench TR2, which is formed in an upper portion of the substrate 100. The second trench TR2 may be positioned between the first and second active regions PR and NR. The first and second active regions PR and NR may be spaced apart from each other, in a first direction D1, with the second trench TR2 interposed therebetween. Each of the first and second active regions PR and NR may be extended in a second direction D2 that is different from the first direction D1.

First active patterns AP1 and second active patterns AP2 may be provided on the first active region PR and the second active region NR, respectively. The first and second active patterns AP1 and AP2 may extend in the second direction D2 and may be parallel to each other. The first and second active patterns AP1 and AP2 may be portions of the substrate 100 protruding in a vertical direction (i.e., a third direction D3). A first trench TR1 may be defined between adjacent ones of the first active patterns AP1 and between adjacent ones of the second active patterns AP2. The first trench TR1 may be shallower than the second trench TR2.

A device isolation layer ST may be in (e.g., may fill) the first and second trenches TR1 and TR2. The device isolation layer ST may be formed of or include silicon oxide. The upper portions of the first and second active patterns AP1 and AP2 may be protruding patterns, which are vertically extended above the device isolation layer ST (e.g., see FIG. 2D). Each of the upper portions of the first and second active patterns AP1 and AP2 may be shaped like a fin. The device isolation layer ST may not cover the upper portions of the first and second active patterns AP1 and AP2. The device isolation layer ST may cover lower portions of side surfaces of the first and second active patterns AP1 and AP2.

First source/drain patterns SD1 may be provided in the upper portions of the first active patterns AP1. The first source/drain patterns SD1 may be impurity regions of a first conductivity type (e.g., p-type). A first channel pattern CH1 may be interposed between a pair of the first source/drain patterns SD1. Second source/drain patterns SD2 may be provided in the upper portions of the second active patterns AP2. The second source/drain patterns SD2 may be impurity regions of a second conductivity type (e.g., n-type). A second channel pattern CH2 may be interposed between a pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor element (e.g., SiGe), whose lattice constant is larger than a lattice constant of a semiconductor element in the substrate 100. Accordingly, the first source/drain patterns SD1 may exert a compressive stress on the first channel patterns CH1. As an example, the second source/drain patterns SD2 may include the same semiconductor element (e.g., Si) as the substrate 100.

Gate electrodes GE may be provided to cross the first and second active patterns AP1 and AP2 and extend in the first direction D1. The gate electrodes GE may be arranged to be spaced apart from each other at a constant pitch in the second direction D2. The gate electrodes GE may overlap the first and second channel patterns CH1 and CH2 in the third direction D3. Each of the gate electrodes GE may enclose a top surface and opposite side surfaces of each of the first and second channel patterns CH1 and CH2.

Referring again to FIG. 2D, the gate electrode GE may be provided on a first top surface TS1 of the first channel pattern CH1 and on at least one first side surface SW1 of the first channel pattern CH1. The gate electrode GE may be provided on a second top surface TS2 of the second channel pattern CH2 and on at least one second side surface SW2 of the second channel pattern CH2. For example, a transistor according to the present embodiment may be a three-dimensional field effect transistor (e.g., FinFET), in which the gate electrode GE is disposed to three-dimensionally surround the channel patterns CH1 and CH2.

Referring again to FIGS. 1 and 2A to 2D, a pair of gate spacers GS may be disposed on opposite side surfaces of each of the gate electrodes GE. The gate spacers GS may extend along the gate electrodes GE and in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may be a multi-layer structure, which includes at least two different materials selected from SiCN, SiCON, and SiN.

A gate capping pattern GP may be provided on each of the gate electrodes GE. The gate capping pattern GP may extend along the gate electrode GE and in the first direction D1. The gate capping pattern GP may be formed of or include at least one of various materials, which have an etch selectivity with respect to first and second interlayer insulating layers 110 and 120 to be described below. For example, the gate capping patterns GP may be formed of or include at least one of SiON, SiCN, SiCON, or SiN.

A gate insulating layer GI may be interposed between the gate electrode GE and the first active pattern AP1 and between the gate electrode GE and the second active pattern AP2. The gate insulating layer GI may extend along a bottom surface of the gate electrode GE thereon. As an example, the gate insulating layer GI may cover the first top surface TS1 and the first side surfaces SW1 of the first channel pattern CH1. The gate insulating layer GI may cover the second top surface TS2 and both of the second side surfaces SW2 of the second channel pattern CH2. The gate insulating layer GI may cover a top surface of the device isolation layer ST below the gate electrode GE (e.g., see FIG. 2D).

In an embodiment, the gate insulating layer GI may be formed of or include a high-k dielectric material, whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may have a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be one of various compounds composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the total number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the thickness of the ferroelectric layer may be in a range from 0.5 to 10 nanometers (nm), but the inventive concept is not limited to this range. Since a critical thickness associated with the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers, which are spaced apart from each other. The gate insulating layer GI may have a multi-layer structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and near the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metallic material, which is selected from the group consisting of titanium (Ti), tantalum (Ta), aluminum (Al), tungsten (W), and molybdenum (Mo), and nitrogen (N). The first metal pattern may further contain carbon (C). The first metal pattern may include a plurality of work function metal layers, which are stacked.

The second metal pattern may include a metallic material whose resistance is lower than the first metal pattern. For example, the second metal pattern may include at least one metallic material that is selected from the group consisting of tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In an embodiment, the first to fourth interlayer insulating layers 110 to 140 may be formed of or include silicon oxide.

A pair of division structures DB may be provided at both sides of the logic cell LC, which are opposite to each other in the second direction D2. The division structure DB may be extended in the first direction D1 and parallel to the gate electrodes GE. In an embodiment, a pitch between the division structure DB and the gate electrode GE adjacent to each other may be equal to the pitch between the gate electrodes GE.

The division structure DB may be provided to penetrate the first and second interlayer insulating layers 110 and 120 and may be extended into the first and second active patterns AP1 and AP2. The division structure DB may penetrate the upper portion of each of the first and second active patterns AP1 and AP2. The division structure DB may separate the first and second active regions PR and NR of the logic cell LC from the active region of a neighboring logic cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE.

The active contact AC may be a self-aligned contact. For example, the active contact AC may be formed by a self-alignment process using the gate capping pattern GP and the gate spacer GS. For example, the active contact AC may cover at least a portion of a side surface of the gate spacer GS. Although not shown, in certain embodiments, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal-silicide materials (e.g., titanium silicide, tantalum silicide, tungsten silicide, nickel silicide, and cobalt-silicide).

A gate contact GC may be provided to penetrate the second interlayer insulating layer 120 and the gate capping pattern GP and to be connected to the gate electrode GE. When viewed in a plan view, the gate contact GC may be provided between the first and second active regions PR and NR. A bottom surface of the gate contact GC may be in contact with the top surface of the gate electrode GE. The gate contact GC may have a top surface that is coplanar with a top surface of the second interlayer insulating layer 120.

Each of the active and gate contacts AC and GC may include a first conductive pattern FM1 and a first barrier pattern BM1 surrounding the first conductive pattern FM1. For example, the first conductive pattern FM1 may be formed of or include at least one of metallic materials (e.g., aluminum, copper, tungsten, molybdenum, ruthenium, and cobalt). The first barrier pattern BM1 may cover side and bottom surfaces of the first conductive pattern FM1. The first barrier pattern BM1 may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. The first metal layer M1 may include first lower interconnection lines LIL1, second lower interconnection lines LIL2, and lower vias VI. The lower vias VI may be provided below the first and second lower interconnection lines LIL1 and LIL2.

The first lower interconnection lines LIL1 may be provided to cross the logic cell LC and to extend in the second direction D2. Each of the first lower interconnection lines LIL1 may be a power line. For example, a drain voltage VDD or a source voltage VSS may be applied to the first lower interconnection line LIL1.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first lower interconnection line LIL1, to which the drain voltage VDD (i.e., a power voltage) is applied, may be disposed on the first cell boundary CB1. The first lower interconnection line LIL1, to which the drain voltage VDD is applied, may extend along the first cell boundary CB1 or in the second direction D2. The first lower interconnection line LIL1, to which the source voltage VSS (i.e., a ground voltage) is applied, may be disposed on the second cell boundary CB2. The first lower interconnection line LIL1, to which the source voltage VSS is applied, may be extended along the second cell boundary CB2 or in the second direction D2.

The second lower interconnection lines LIL2 may be disposed between the first lower interconnection lines LIL1, which are respectively applied with the drain voltage VDD and the source voltage VSS. The second lower interconnection lines LIL2 may be extended in the second direction D2 and parallel to each other. When viewed in a plan view, the second lower interconnection lines LIL2 may be line- or bar-shaped patterns. The second lower interconnection lines LIL2 may be arranged at a constant pitch in the first direction D1.

Referring again to FIG. 2C, a line width of each of the first lower interconnection lines LIL1 may be a first width W1. A line width of each of the second lower interconnection lines LIL2 may be a second width W2. The second width W2 may be smaller than the first width W1. For example, the second width W2 may be smaller than 12 nm. The first width W1 may be larger than 12 nm.

Each of the first and second lower interconnection lines LIL1 and LIL2 may include a second conductive pattern FM2 and a second barrier pattern BM2 surrounding the second conductive pattern FM2. The second barrier pattern BM2 may have a 'U'-shaped section. A top surface of the second barrier pattern BM2 may be substantially coplanar with a top surface of the third interlayer insulating layer 130. As another example, the top surface of the second barrier pattern BM2 may be lower than the top surface of the third interlayer insulating layer 130.

The second barrier pattern BM2 may improve an adhesion property between the lower interconnection line LIL1 or LIL2 and the third interlayer insulating layer 130. The second barrier pattern BM2 may serve as a barrier impeding/preventing metallic elements in the second conductive pattern FM2 from being diffused into the third interlayer insulating layer 130. The second barrier pattern BM2 may be formed of or include at least one of tantalum nitride (TaN), titanium nitride (TiN), tantalum oxide (TaO), titanium oxide (TiO), manganese nitride (MnN), or manganese oxide (MnO).

The second conductive pattern FM2 may be provided on the second barrier pattern BM2. The second barrier pattern BM2 may cover opposite side surfaces and a bottom surface of the second conductive pattern FM2. The second conductive pattern FM2 may have the largest volume, among metal patterns constituting the lower interconnection line LIL1 or LIL2. The second conductive pattern FM2 may be formed of or include at least one of, for example, copper (Cu), ruthenium (Ru), cobalt (Co), tungsten (W), or molybdenum (Mo).

Although not shown, a metal capping pattern may be further provided on the second conductive pattern FM2. The metal capping pattern may be a film-shaped pattern that covers a top surface of the second conductive pattern FM2 and has a constant small thickness. The metal capping pattern may be formed of or include at least one of ruthenium (Ru), cobalt (Co), or graphene.

The lower vias VI may be interposed between the first and second lower interconnection lines LIL1 and LIL2 and the active contacts AC. The lower vias VI may be interposed between the second lower interconnection lines LIL2 and the gate contacts GC.

In an embodiment, the first and second lower interconnection lines LIL1 and LIL2 and the lower vias VI of the first metal layer M1 may be formed, one at a time, using a single damascene process. In an embodiment, the first and second lower interconnection lines LIL1 and LIL2 and the lower vias VI of the first metal layer M1 may be formed, at once (i.e., concurrently), using a dual damascene process.

An etch stop layer ESL may be interposed between the third and fourth interlayer insulating layers 130 and 140. The etch stop layer ESL may directly cover the first and second lower interconnection lines LIL1 and LIL2. The etch stop layer ESL may cover the top surface of the third interlayer insulating layer 130.

The etch stop layer ESL may have a single-layer structure or a multiple-layer structure including a plurality of stacked layers. In an embodiment, the etch stop layer ESL may include a metal oxide layer or a metal nitride layer which contains at least one metallic element selected from the group consisting of Al, Zr, Y, Hf, and Mo. In an embodiment, the etch stop layer ESL may include a silicon oxide layer or a silicon nitride layer.

A second metal layer M2 may be provided in the fourth interlayer insulating layer 140. The second metal layer M2 may include upper interconnection lines UIL (e.g., upper wires) that are on and electrically connected to the second lower interconnection lines LIL2 (e.g., lower wires). The upper interconnection lines UIL may be extended in the first direction D1 and parallel to each other. When viewed in a plan view, the upper interconnection lines UIL may have a line shape or a bar shape. The upper interconnection lines UIL may be arranged in the second direction D2.

The upper interconnection line UIL may include a line structure FMS and a via structure VCS. The line structure FMS may be provided on the fourth interlayer insulating layer 140 and may be extended in the first direction D1.

The via structure VCS may be provided in a lower portion of the fourth interlayer insulating layer 140 and may be extended from the line structure FMS toward the first metal layer M1. That is, the via structure VCS may be a via or contact plug, which is interposed between the first metal layer M1 and the line structure FMS to connect them to each other. The via structure VCS may be provided to penetrate the fourth interlayer insulating layer 140 and the etch stop layer ESL and may be coupled to the lower interconnection line LIL1 or LIL2 of the first metal layer M1.

The line structure FMS and the via structure VCS may be formed of or include metallic materials that are different from each other. The line structure FMS may be formed of or include a metallic material that is selected from the group consisting of copper (Cu), cobalt (Co), ruthenium (Ru), tungsten (W), molybdenum (Mo), aluminum (Al), silver (Ag), and gold (Au). The via structure VCS may be formed of or include a metallic material (e.g., molybdenum (Mo), ruthenium (Ru), tungsten (W), cobalt (Co), or a binary metal provided as a combination thereof), which can be directly formed on the fourth interlayer insulating layer 140 without a barrier metal therebetween. In an embodiment, the line structure FMS may be formed of or include copper (Cu), and the via structure VCS may be formed of or include molybdenum (Mo). In an embodiment, an electrical resistivity of the metal of the via structure VCS may be lower than that of the metal of the line structure FMS and in this case, a via resistance of the upper interconnection line UIL may be reduced.

The via structure VCS may include a via portion VIP and a barrier portion BAP. The via portion VIP of the via structure VCS may be provided below the line structure FMS to serve as a via plug connected to the first metal layer M1. The barrier portion BAP of the via structure VCS may be extended from the via portion VIP in a vertical direction (i.e., the third direction D3). The barrier portion BAP may be interposed between the fourth interlayer insulating layer 140 and the line structure FMS. The barrier portion BAP may serve as a barrier pattern impeding/preventing a metallic element in the line structure FMS from being diffused into the fourth interlayer insulating layer 140.

The via and barrier portions VIP and BAP of the via structure VCS may be formed of or include the same metal (e.g., molybdenum (Mo)). The via and barrier portions VIP and BAP may be connected to each other (e.g., physically integrated together) to constitute the via structure VCS, which is provided as a single continuous object.

According to an embodiment of the inventive concept, the via structure VCS may be composed of the via portion VIP and the barrier portion BAP, which are used as a via plug and a barrier pattern, respectively. That is, the via structure VCS may be a hybrid structure serving as both the via plug and the barrier pattern.

The upper interconnection line UIL of the second metal layer M2 may be formed using a dual damascene process. That is, the upper interconnection line UIL may be formed by sequentially forming the via structure VCS and the line structure FMS in a trench, which will be filled with the upper interconnection line UIL.

The upper interconnection line UIL according to the present embodiment will be described in more detail with reference to FIG. 3. A via hole VIH and a line trench LTR, which are filled with the upper interconnection line UIL, may be formed in the fourth interlayer insulating layer 140. The line trench LTR may be a line-shaped trench, which is formed in an upper portion of the fourth interlayer insulating layer 140. The via hole VIH may be extended from the line trench LTR toward the lower interconnection line LIL1 or LIL2. The via hole VIH may be provided to penetrate the etch stop layer ESL and to expose a top surface of the lower interconnection line LIL1 or LIL2.

The upper interconnection line UIL may include the line structure FMS and the via structure VCS. The via structure VCS may include the via portion VIP and the barrier portion BAP. The via portion VIP of the via structure VCS may fully fill the via hole VIH. Since the via hole VIH is filled with only the via portion VIP, the via portion VIP may be in direct contact with the fourth interlayer insulating layer 140. A bottom surface of the via portion VIP may be in contact with the top surface of the lower interconnection line LIL1 or LIL2 that is exposed through the via hole VIH.

The barrier portion BAP of the via structure VCS may be provided in the line trench LTR. The barrier portion BAP may cover an inner surface of the line trench LTR. That is, the barrier portion BAP may be in direct contact with the fourth interlayer insulating layer 140. The line structure FMS may be provided in a remaining space of the line trench LTR, except the barrier portion BAP.

In an embodiment, the line structure FMS may include a first conductive layer MEP1 and a second conductive layer MEP2. The first conductive layer MEP1 may be interposed between the barrier portion BAP and the second conductive layer MEP2. The first conductive layer MEP1 may have a U-shaped section. The first conductive layer MEP1 may improve an adhesion property between the second conductive layer MEP2 and the barrier portion BAP.

The second conductive layer MEP2 may have the largest volume, among conductive layers constituting the upper interconnection line UIL. The second conductive layer MEP2 may contain a metallic material of relatively low resistivity. The first and second conductive layers MEP1 and MEP2 may be formed of or include different metallic materials that are selected from the group consisting of copper (Cu), cobalt (Co), ruthenium (Ru), tungsten (W), molybdenum (Mo), aluminum (Al), silver (Ag), and gold (Au). For example, the first conductive layer MEP1 may be formed of or include cobalt (Co), and the second conductive layer MEP2 may be formed of or include copper (Cu).

In an embodiment, the first conductive layer MEP1 may be omitted from the line structure FMS. For example, the line structure FMS may be composed of only a single conductive layer (e.g., the second conductive layer MEP2).

A thickness of the barrier portion BAP, which is in contact with the fourth interlayer insulating layer 140, may increase as it goes in a downward direction. For example, a first portion of the barrier portion BAP that is located at an upper region of the line trench LTR may have a first thickness T1. A second portion of the barrier portion BAP that is located at an intermediate region of the line trench LTR may have a second thickness T2. A third portion of the barrier portion BAP that is located at a lower region of the line trench LTR and/or adjacent to the via portion VIP may have a third thickness T3. Here, the second thickness T2 may be larger than the first thickness T1, and the third thickness T3 may be larger than the second thickness T2. In other words, the thickness of the barrier portion BAP in contact with the fourth interlayer insulating layer 140 may be increased in a direction toward the via portion VIP.

The via structure VCS (e.g., the via portion VIP thereof) may include a protruding portion PTP, which has a shape protruding above sidewalls of the via portion VIP. The protruding portion PTP may convexly protrude toward a center of the line structure FMS in the third direction D3. A width W3 of the protruding portion PTP may decrease as it goes in the third direction D3. The protruding portion PTP (e.g., the highest point thereof) may be located at a level that is higher than a bottom BOT of the line trench LTR and higher than a lower portion of the barrier portion BAP. For example, the highest point of the protruding portion PTP may be higher than the third portion of the barrier portion BAP that has the third thickness T3, as well as higher than a fourth portion of the barrier portion BAP that is on the bottom BOT of the line trench LTR.

Due to the presence of the protruding portion PTP, a contact surface between the via and line structures VCS and FMS may have a convex profile. That is, an area of the contact surface between the via and line structures VCS and FMS may be increased by the protruding portion PTP. Owing to the increase of the contact area, the electrical resistance between the via and line structures VCS and FMS may be reduced.

Since the via structure VCS is formed to fully fill the via hole VIH, the protruding portion PTP may be provided in the line trench LTR. Accordingly, the protruding portion PTP may have a horizontally expanded shape, compared with the via hole VIH, as shown in the portion N of FIG. 2C. In this case, a contact area between the via and line structures VCS and FMS may be increased, and thus, the electrical resistance therebetween may be further reduced. In addition, since the via structure VCS is formed to fully fill the via hole VIH, the line trench LTR may be more easily filled with the line structure FMS. Accordingly, it may be possible to impede/prevent process defects from occurring in a process of fabricating the semiconductor device.

The barrier portion BAP of the via structure VCS may serve as a barrier pattern impeding/preventing a metallic element in the line structure FMS from being diffused into the fourth interlayer insulating layer 140. To improve the barrier function of the barrier portion BAP, the barrier portion BAP may be provided to have a relatively high nitrogen concentration. To improve the function of the via portion VIP as a low resistance contact element, the via portion VIP may be formed of a nitrogen-free material or may be formed to have a relatively low nitrogen concentration. The nitrogen concentration of the barrier portion BAP, which is interposed between the line structure FMS and the fourth interlayer insulating layer 140, may range from 1 at % to 20 at %. The nitrogen concentration of the via portion VIP may range from 0 at % to 1 at %.

Figure 4:
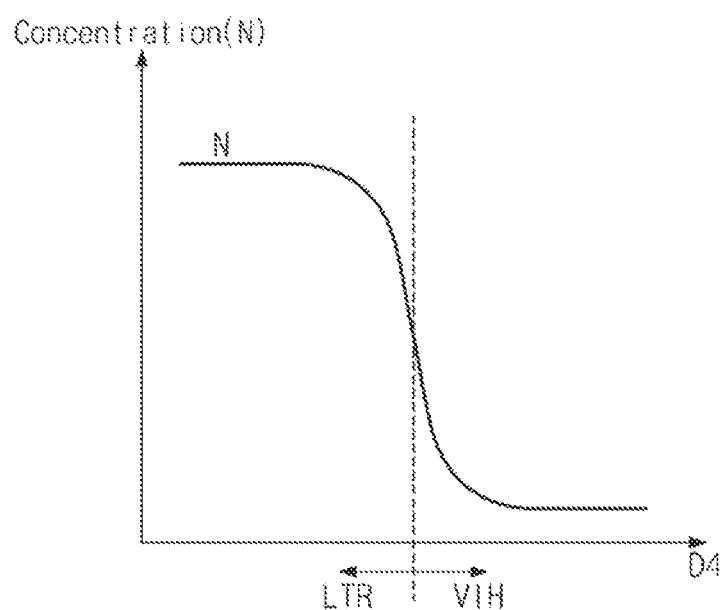
FIG. 4 is a graph showing a nitrogen concentration of a via structure of FIG. 3 measured in a fourth direction.

FIG. 4 is a graph showing a nitrogen concentration of the via structure VCS of FIG. 3 measured in a fourth direction D4. The fourth direction D4 may be a direction that is opposite to the third direction D3. Referring to FIG. 4, a nitrogen concentration decreases in the fourth direction D4 from the barrier portion BAP of the via structure VCS toward the via portion VIP. The nitrogen concentration of the barrier portion BAP may be higher than the nitrogen concentration of the via portion VIP.

In the present embodiment, the barrier portion BAP may be formed to contain nitrogen (N) atoms, and in this case, the barrier portion BAP serving as a barrier pattern may have an excellent function as a barrier impeding/preventing a metal diffusion issue. By contrast, the via portion VIP may be formed such that it does not contain nitrogen (N), and in this case, the via portion VIP serving as a via plug may have an excellent function as a low resistance contact element.

Figure 10A:
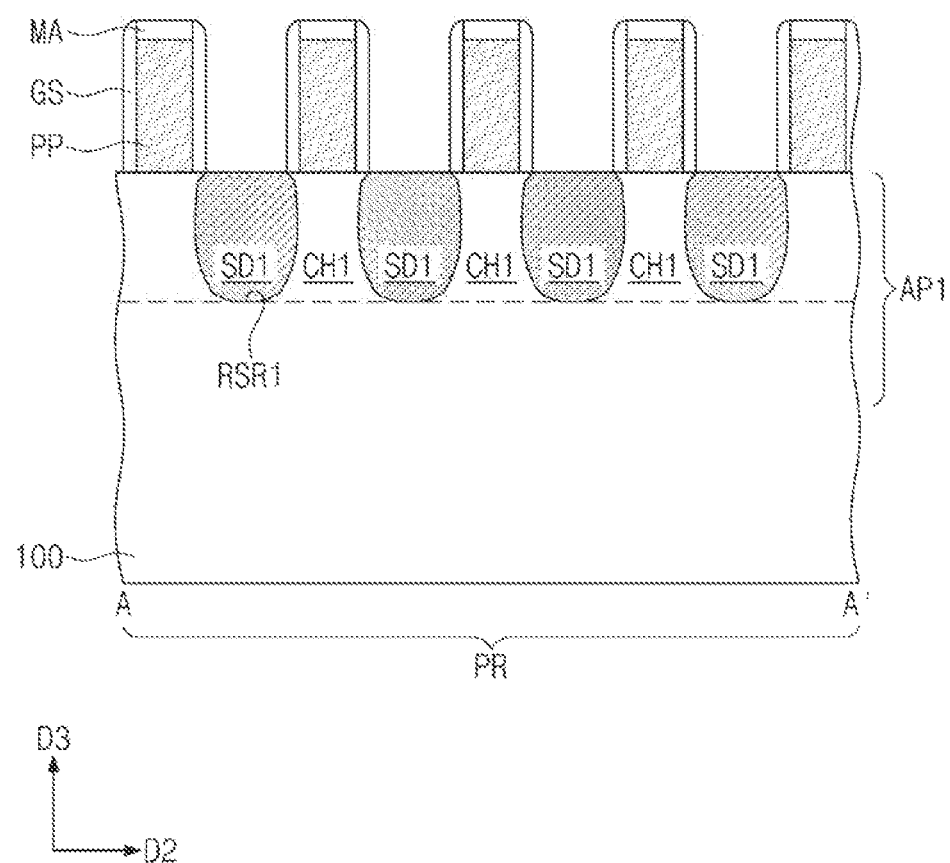
Figure 10B:
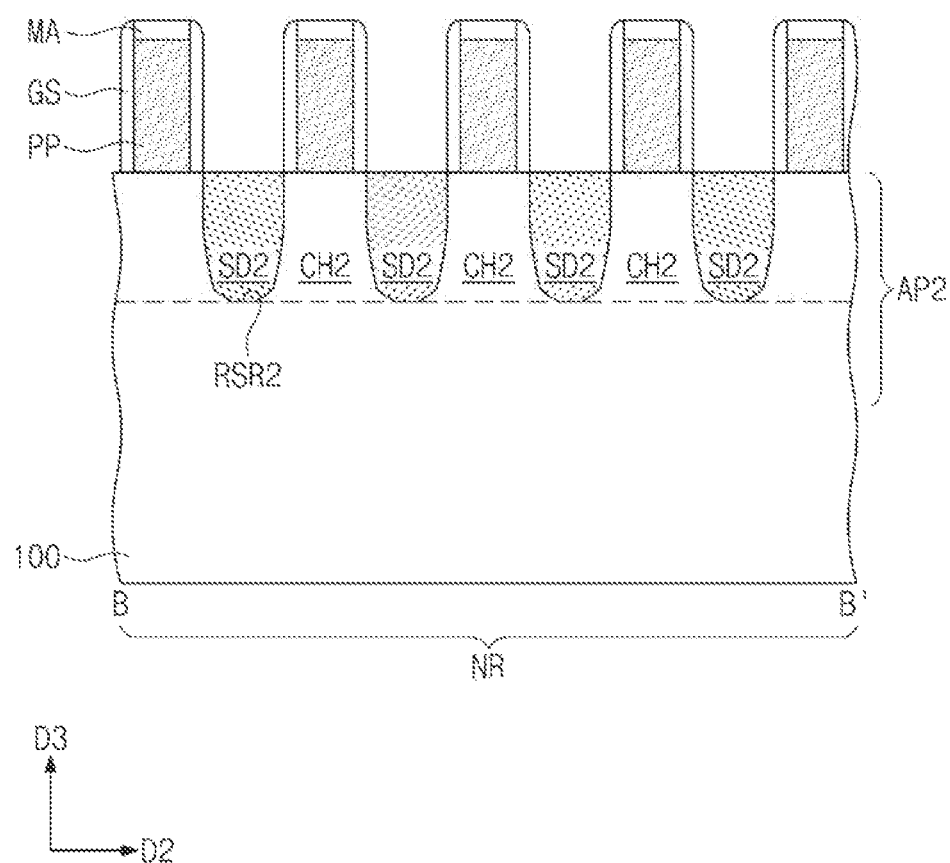
Figure 10C:
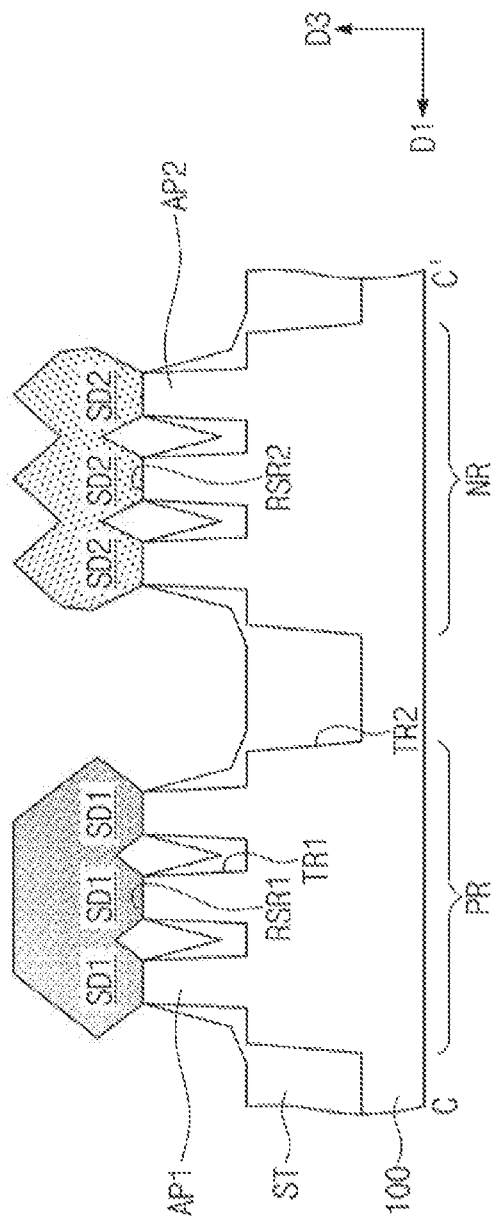
FIGS. 10C, 12C, and 14C are sectional views taken along lines C-C' of FIGS. 9, 11, and 13, respectively.
Figure 10D:
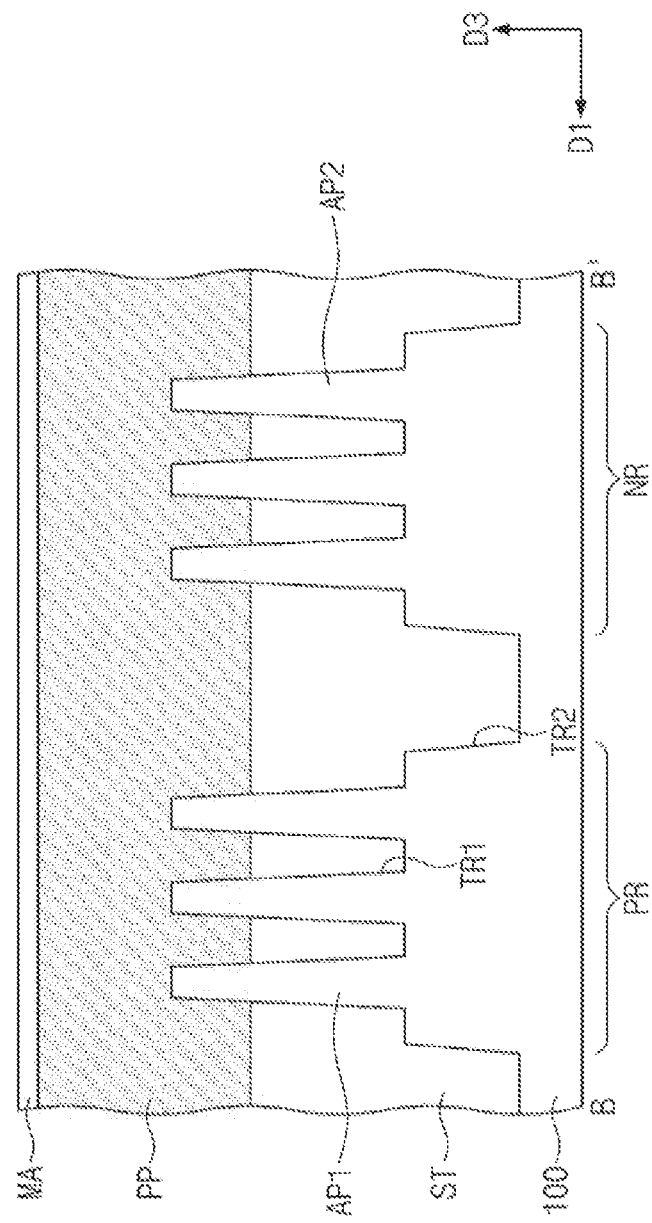
FIGS. 10D, 12D, and 14D are sectional views taken along lines D-D' of FIGS. 9, 11, and 13, respectively.
Figure 11:
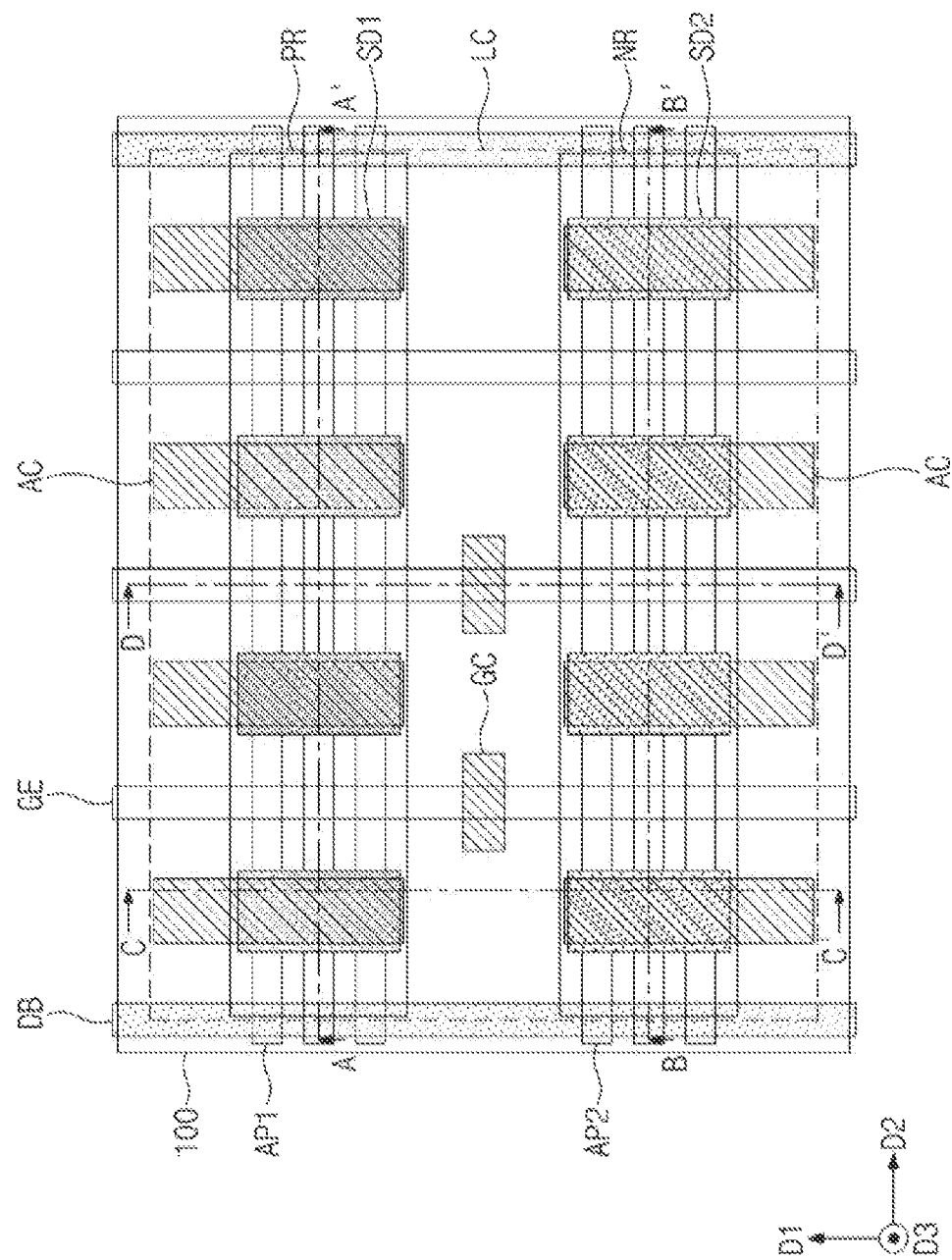
Figure 12A:
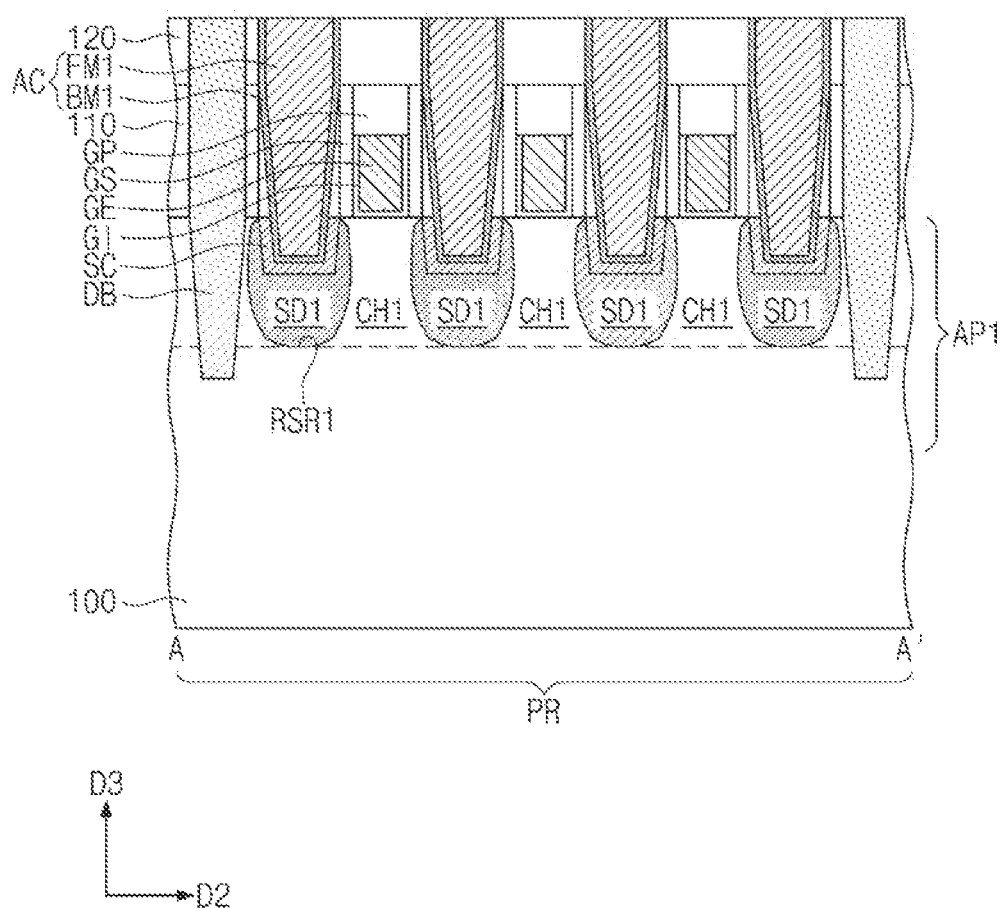
Figure 12B:
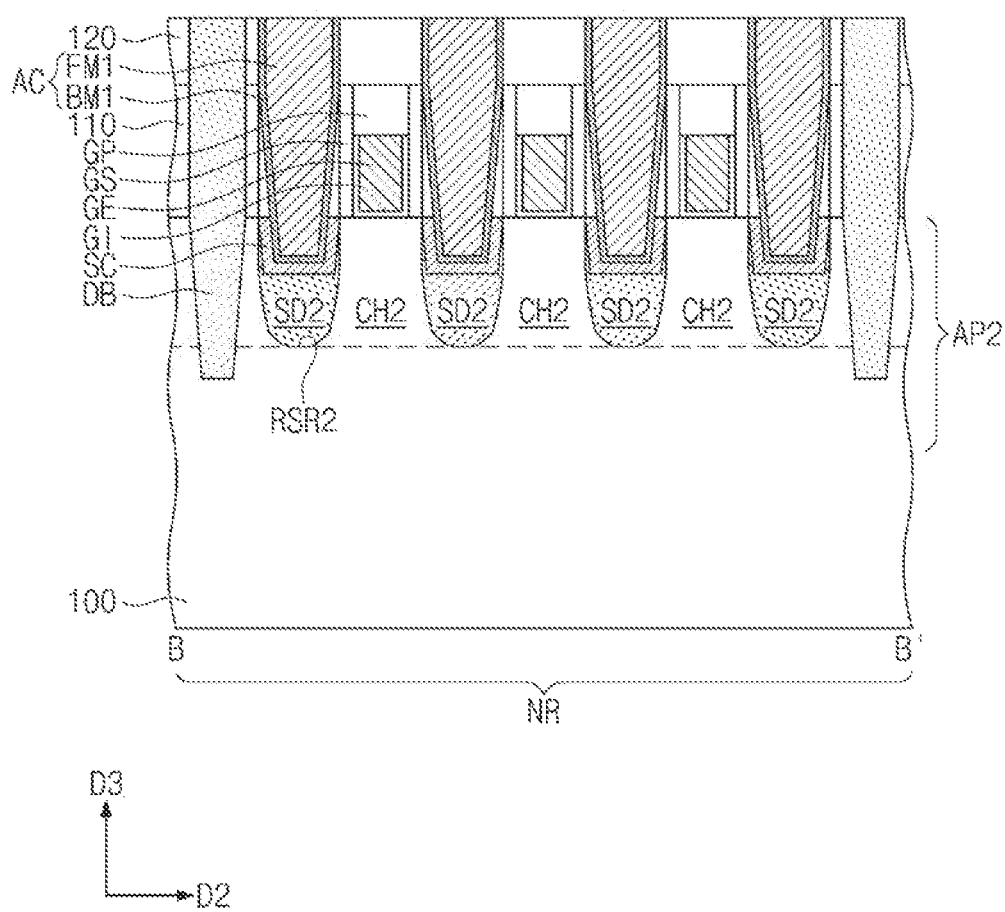
Figure 12C:
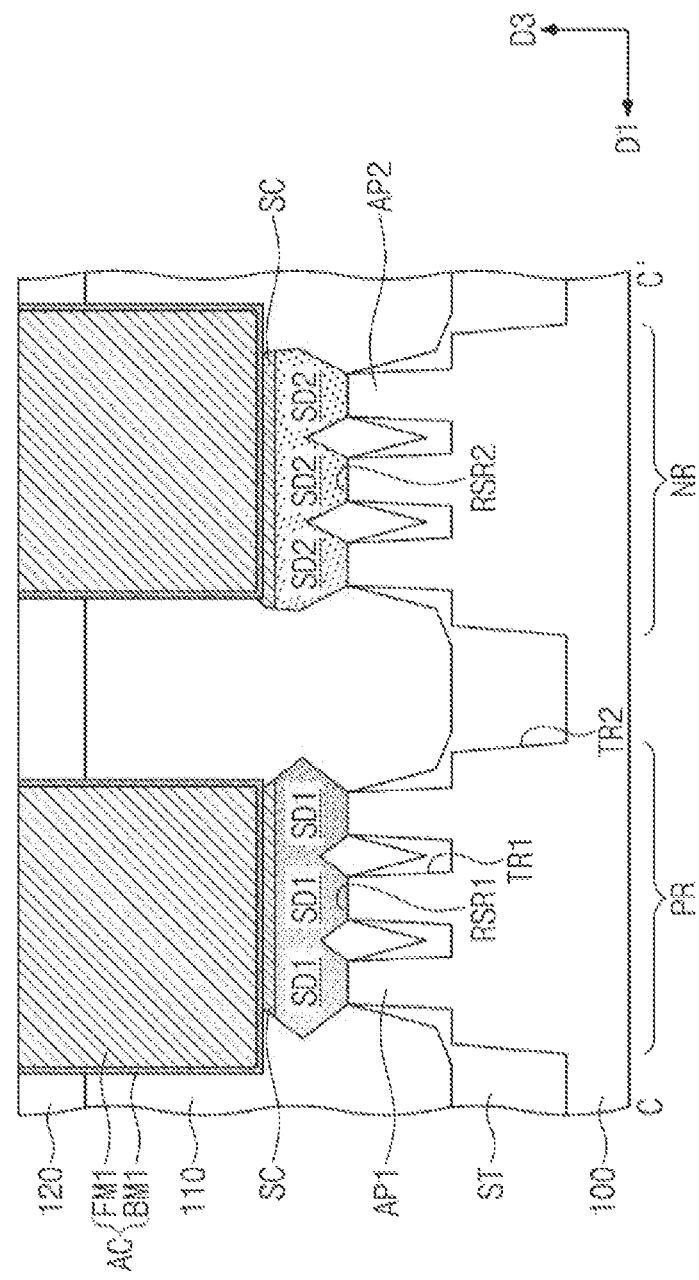
Figure 12D:
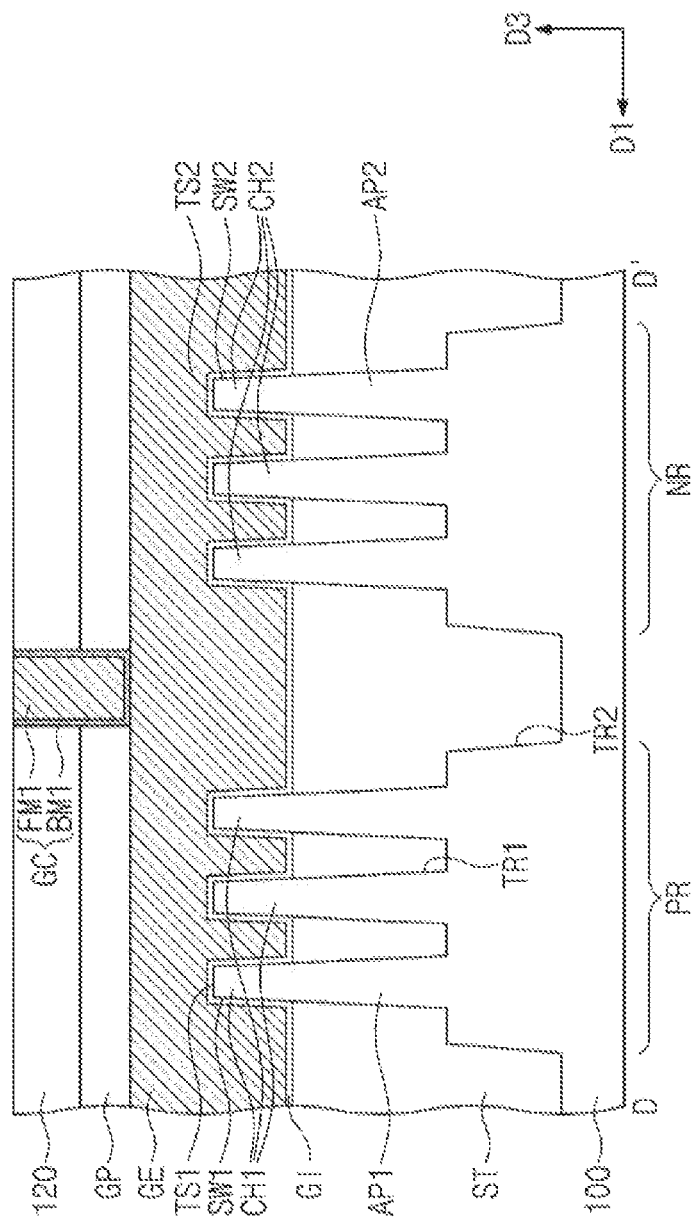
Figure 13:
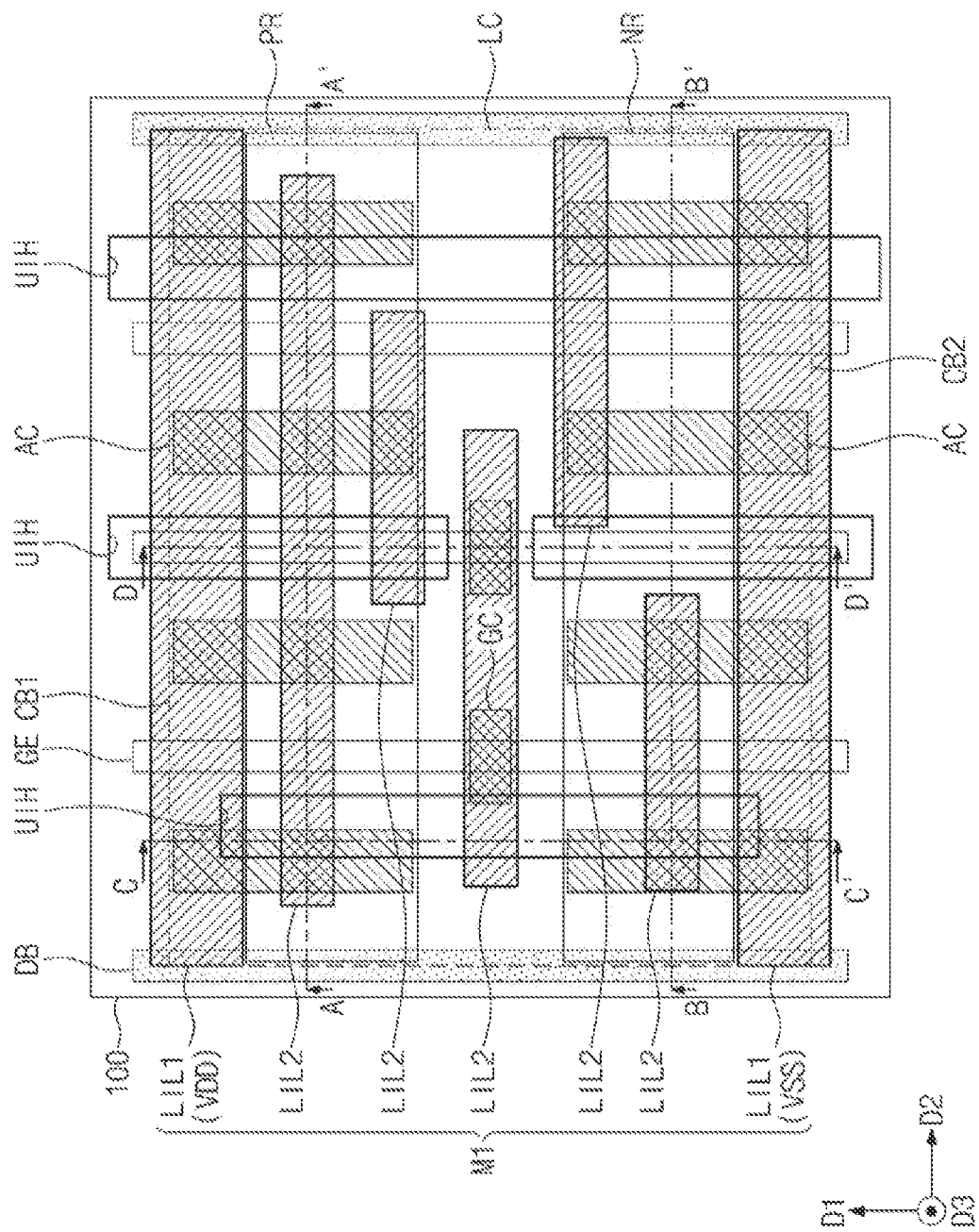
Figure 14A:
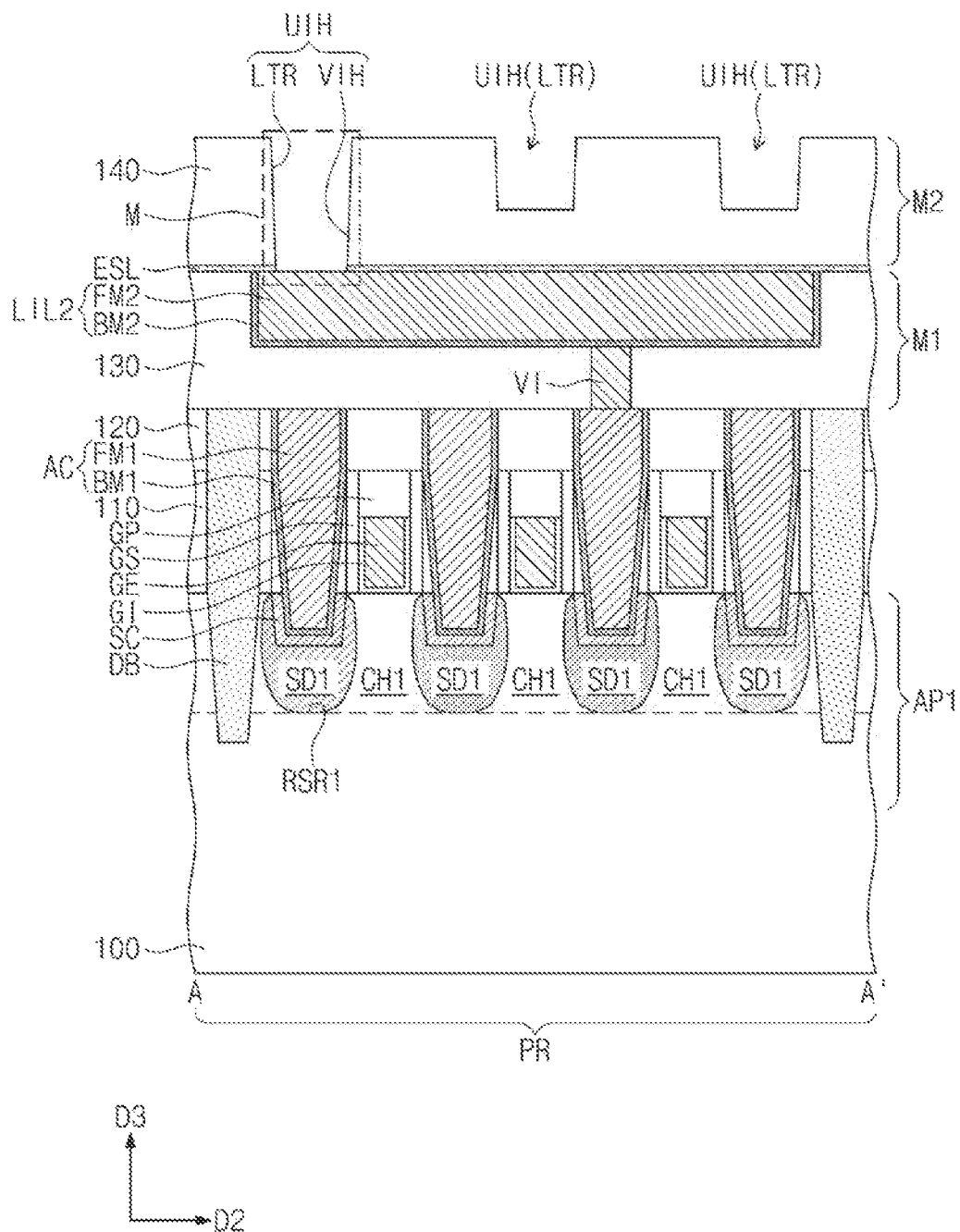
Figure 14B:
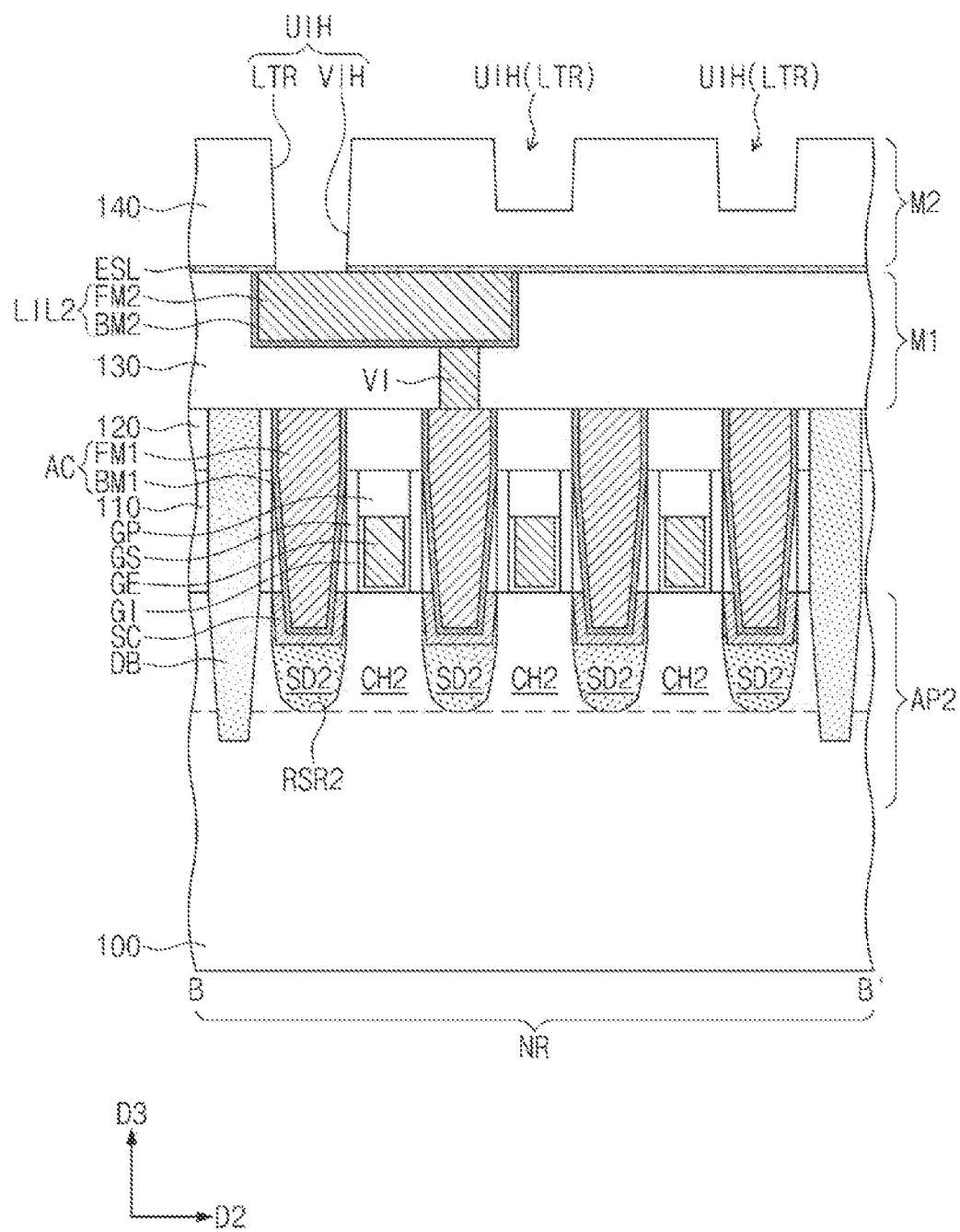
Figure 14C:
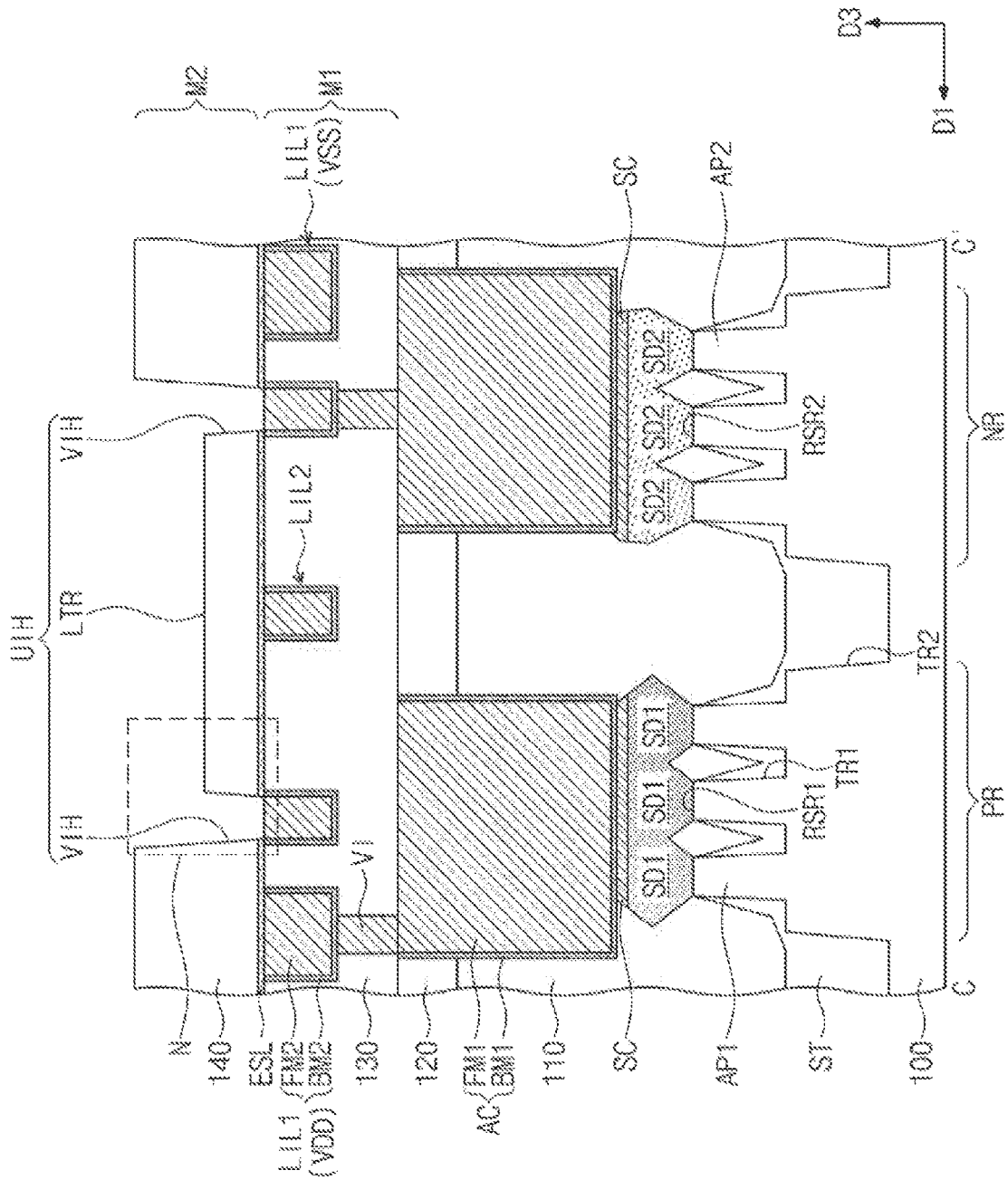
Figure 14D:
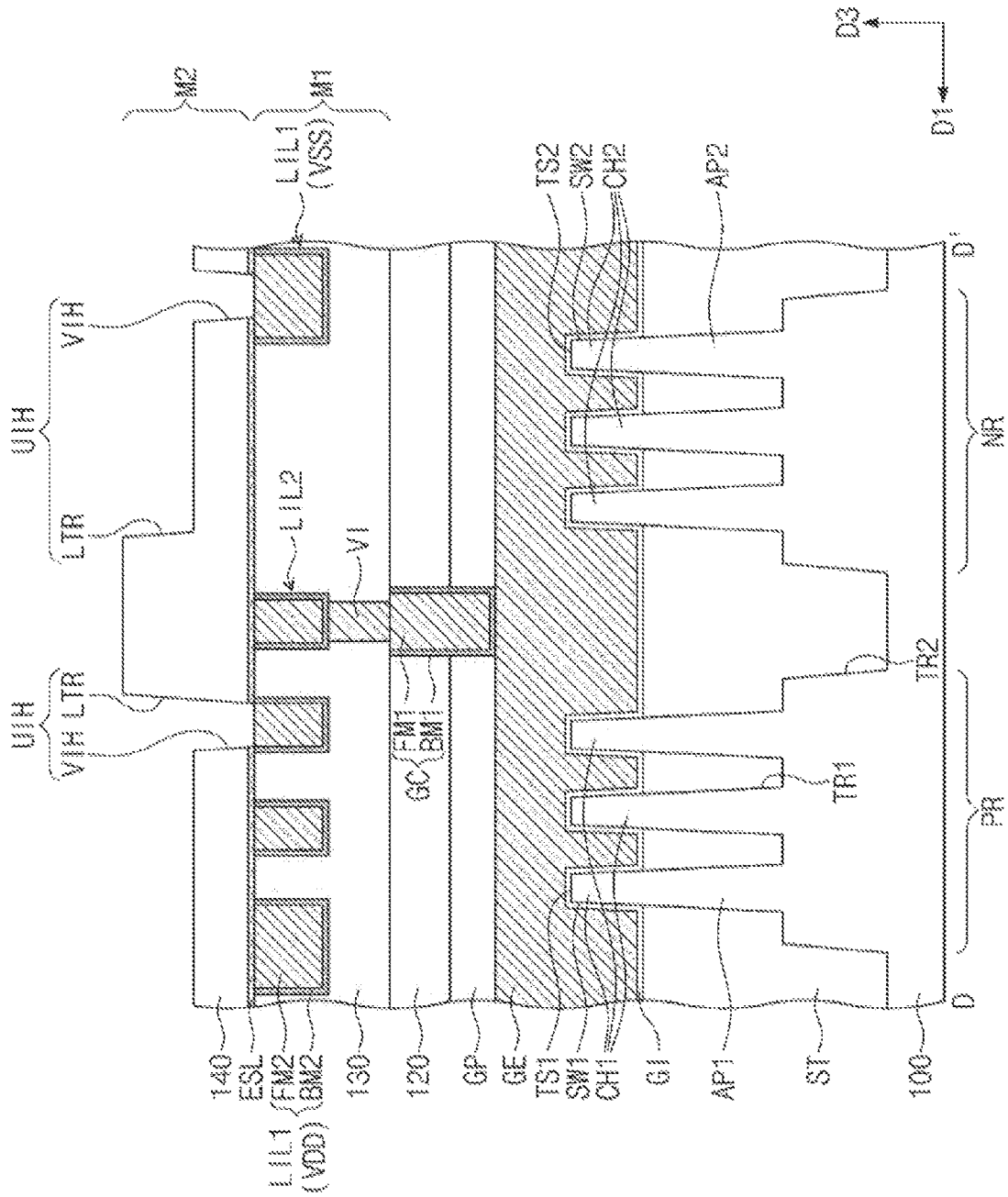
Figure 15:
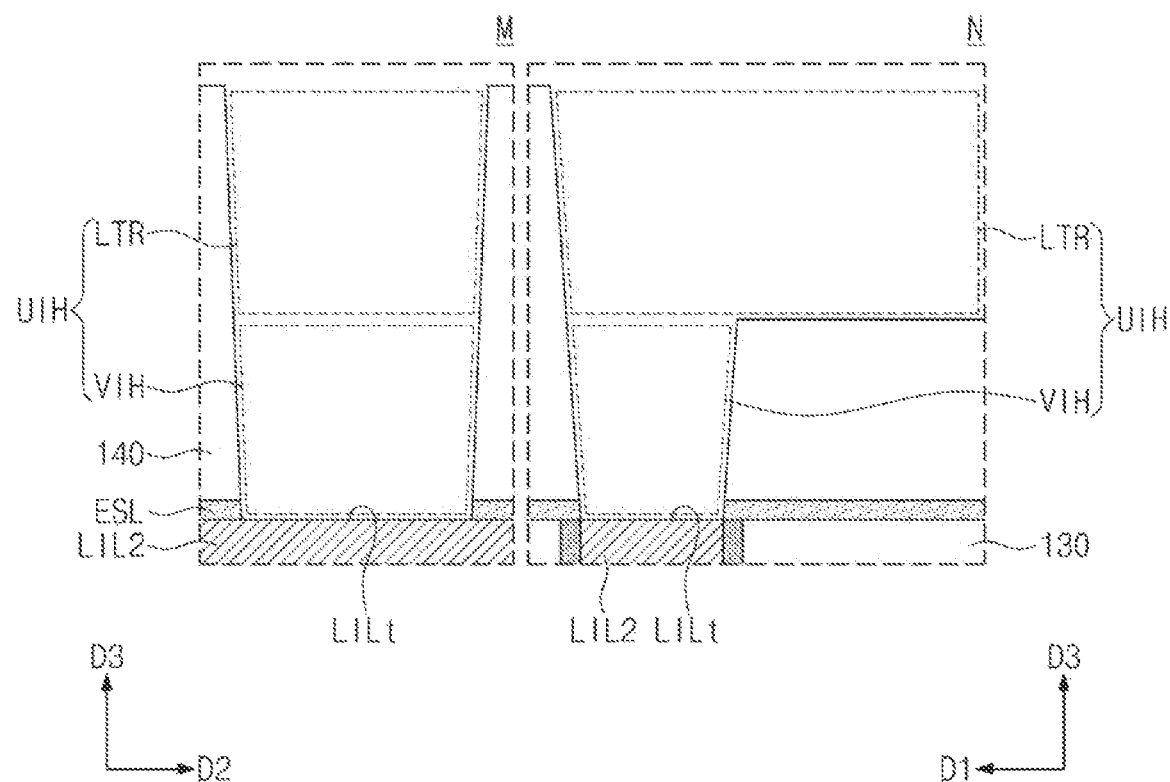
FIGS. 15 to 17 are sectional views, which illustrate a portion M of FIG. 14A and a portion N of FIG. 14C and illustrate a method of forming an upper interconnection line, according to an embodiment of the inventive concept.
Figure 16:
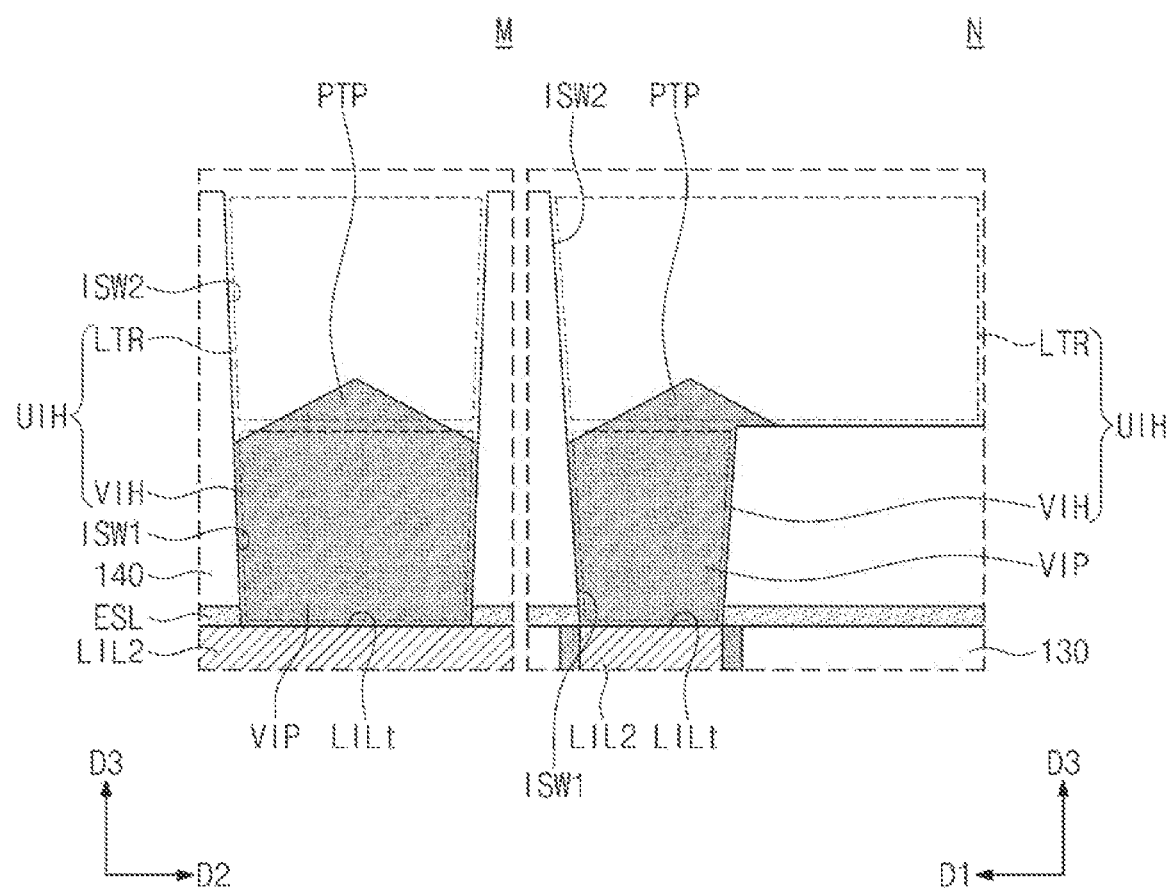
Figure 17:
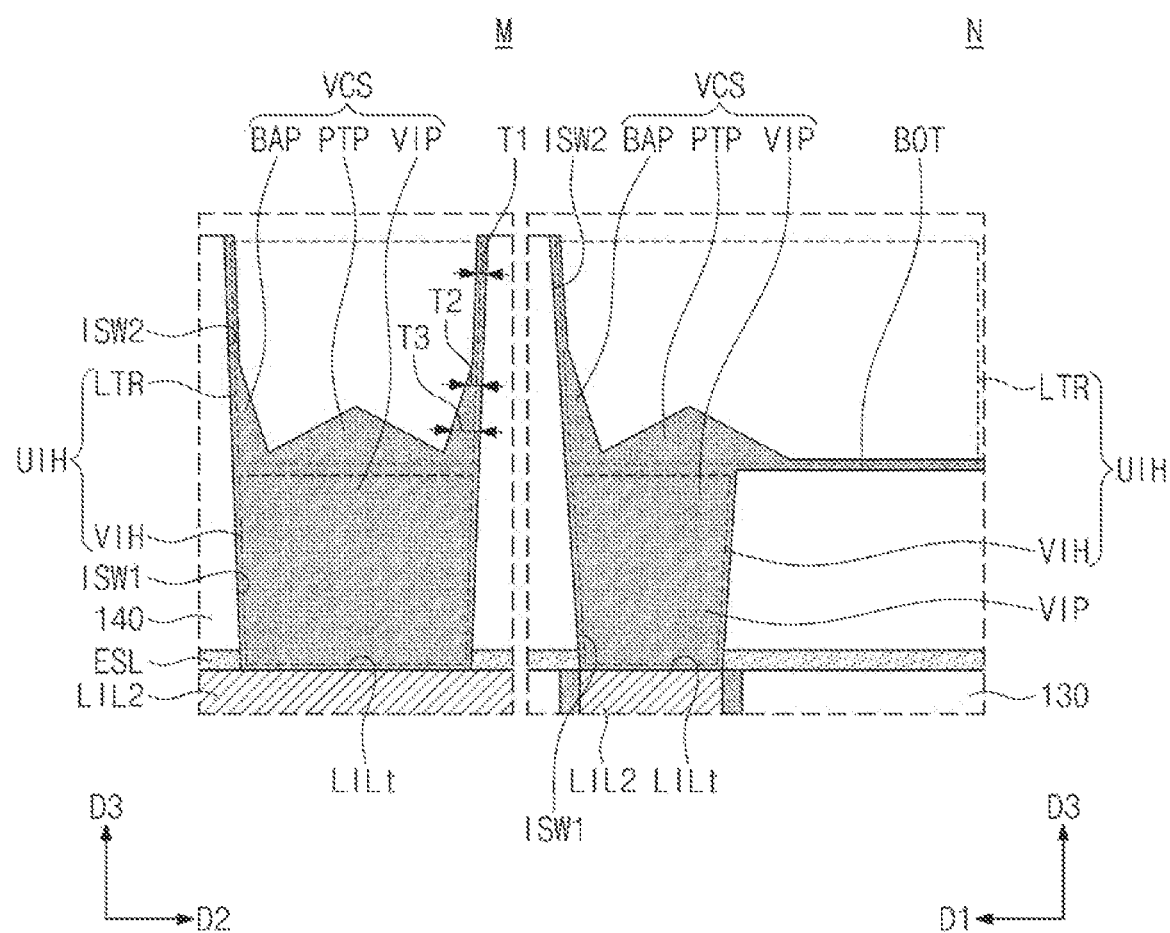

FIGS. 5, 7, 9, 11, and 13 are plan views illustrating a method of fabricating a semiconductor device, according to an embodiment of the inventive concept. FIGS. 6, 8A, 10A, 12A, and 14A are sectional views taken along lines A-A' of FIGS. 5, 7, 9, 11, and 13, respectively. FIGS. 8B, 10B, 12B, and 14B are sectional views taken along lines B-B' of FIGS. 7, 9, 11, and 13, respectively. FIGS. 10C, 12C, and 14C are sectional views taken along lines C-C' of FIGS. 9, 11, and 13, respectively. FIGS. 10D, 12D, and 14D are sectional views taken along lines D-D' of FIGS. 9, 11, and 13, respectively. FIGS. 15 to 17 are sectional views, which illustrate a portion M of FIG. 14A and a portion N of FIG. 14C and illustrate a method of forming an upper interconnection line, according to an embodiment of the inventive concept.

Figure 5:
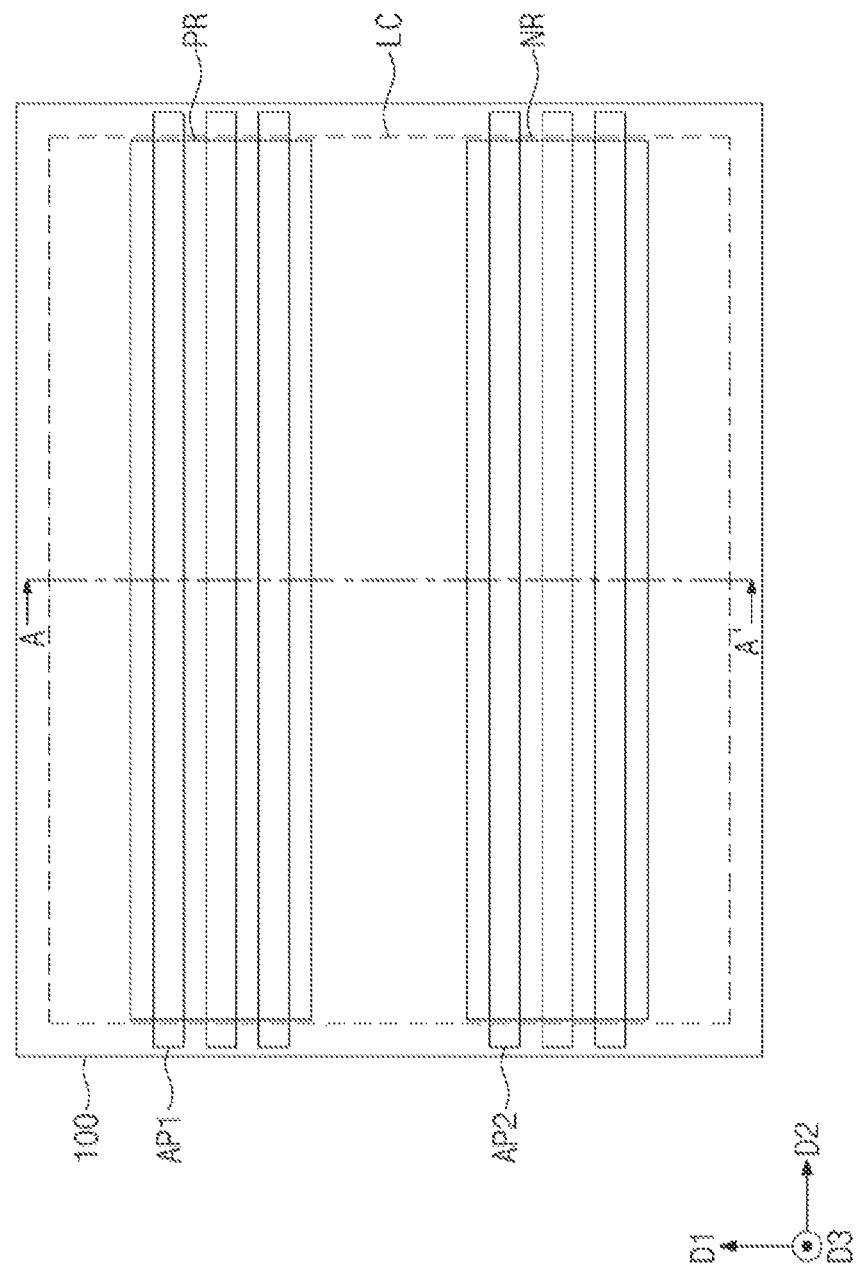
FIGS. 5, 7, 9, 11, and 13 are plan views illustrating a method of fabricating a semiconductor device, according to an embodiment of the inventive concept.
Figure 6:
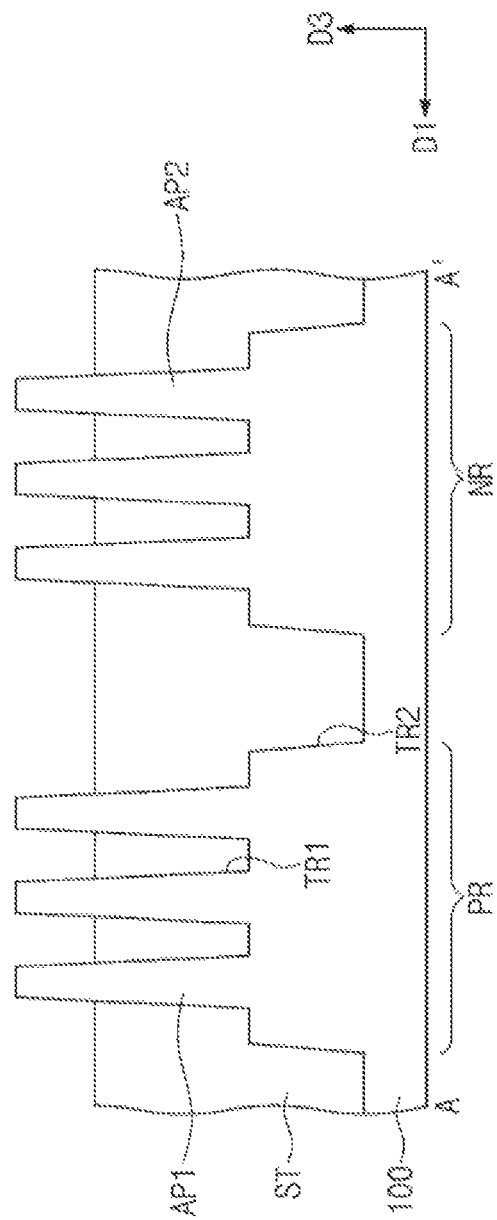
FIGS. 6, 8A, 10A, 12A, and 14A are sectional views taken along lines A-A' of FIGS. 5, 7, 9, 11, and 13, respectively.

Referring to FIGS. 5 and 6, the substrate 100 including the first and second active regions PR and NR may be provided. The first and second active regions PR and NR may define the logic cell LC on the substrate 100.

The first and second active patterns AP1 and AP2 may be formed by patterning the substrate 100. The first active patterns AP1 may be formed on the first active region PR, and the second active patterns AP2 may be formed on the second active region NR. The first trench TR1 may be formed between the first active patterns AP1 and between the second active patterns AP2. The second trench TR2 may be formed by patterning a portion of the substrate 100 between the first and second active regions PR and NR. The second trench TR2 may be formed to have a depth that is larger than that of the first trench TR1.

The device isolation layer ST may be formed on the substrate 100 in (e.g., to fill) the first and second trenches TR1 and TR2. The device isolation layer ST may be formed of or include an insulating material (e.g., silicon oxide). The device isolation layer ST may be recessed to expose upper portions of the first and second active patterns AP1 and AP2.

For example, the upper portions of the first and second active patterns AP1 and AP2 may protrude vertically above the device isolation layer ST.

Figure 7:
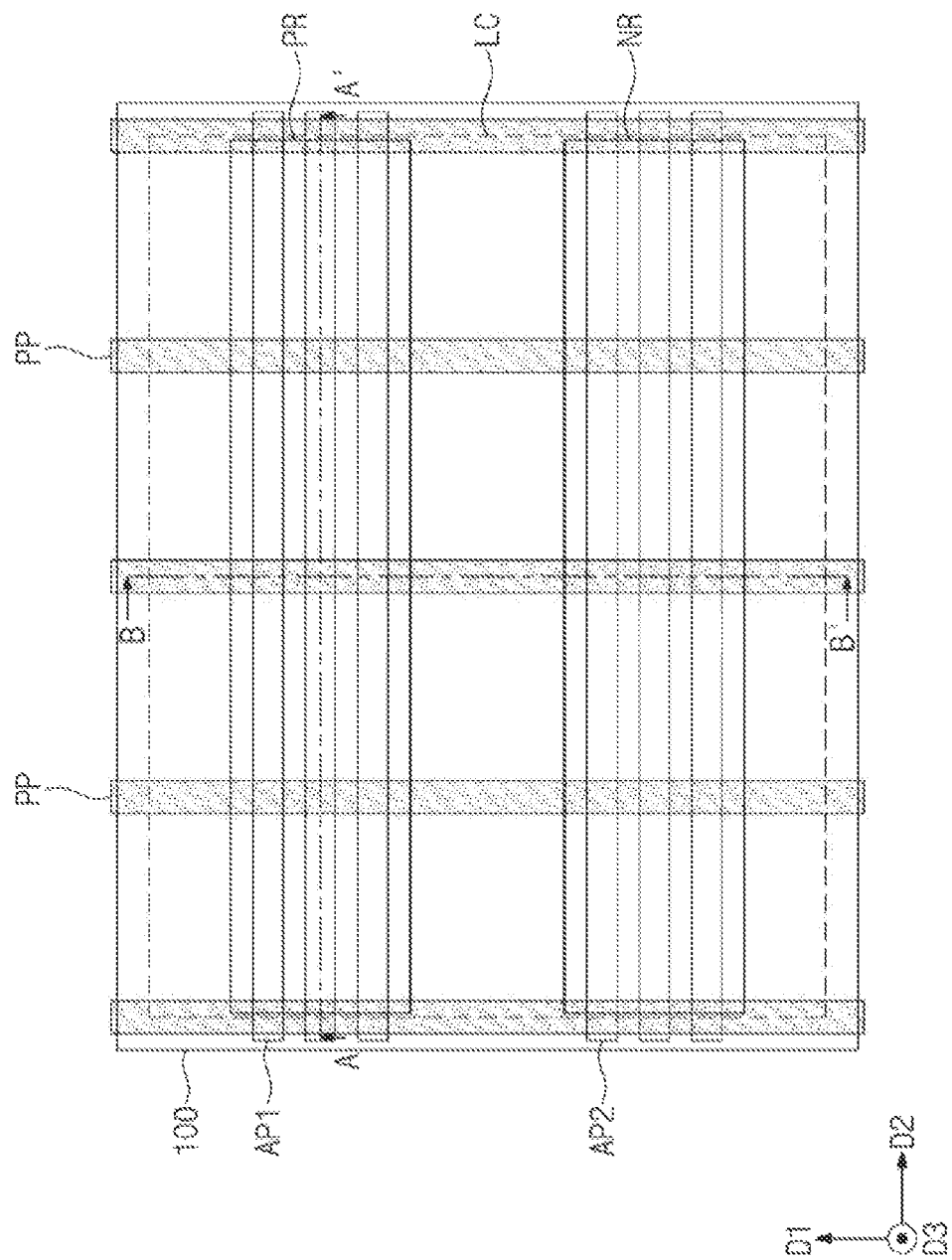
Figure 8A:
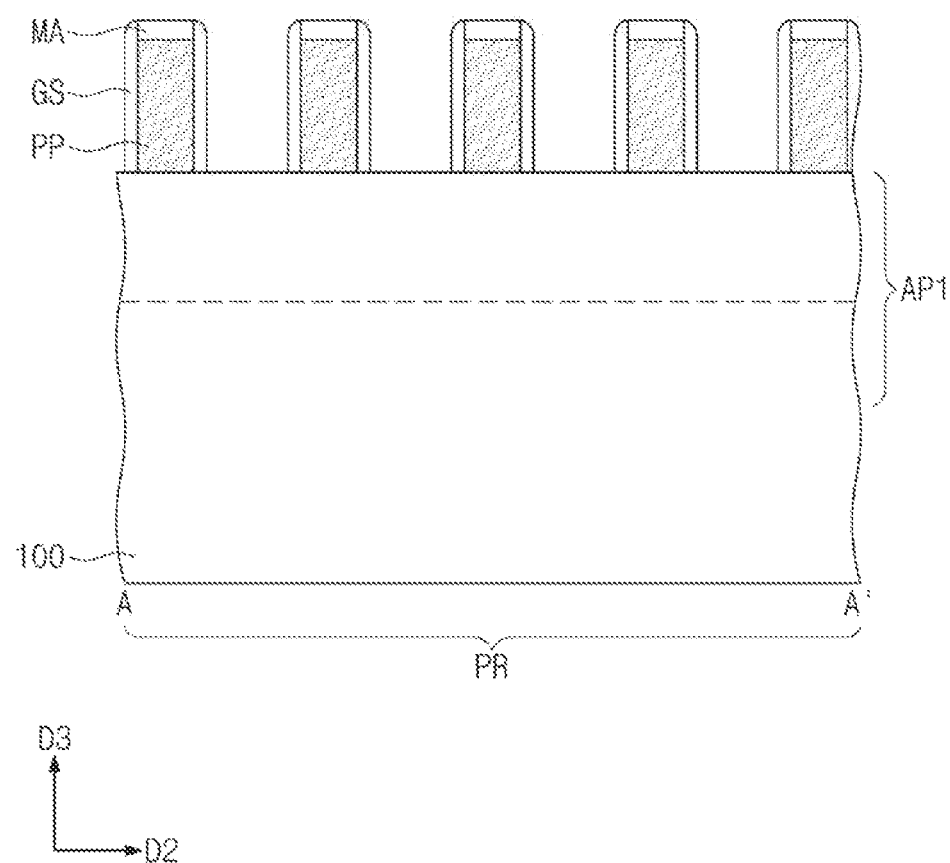
Figure 8B:
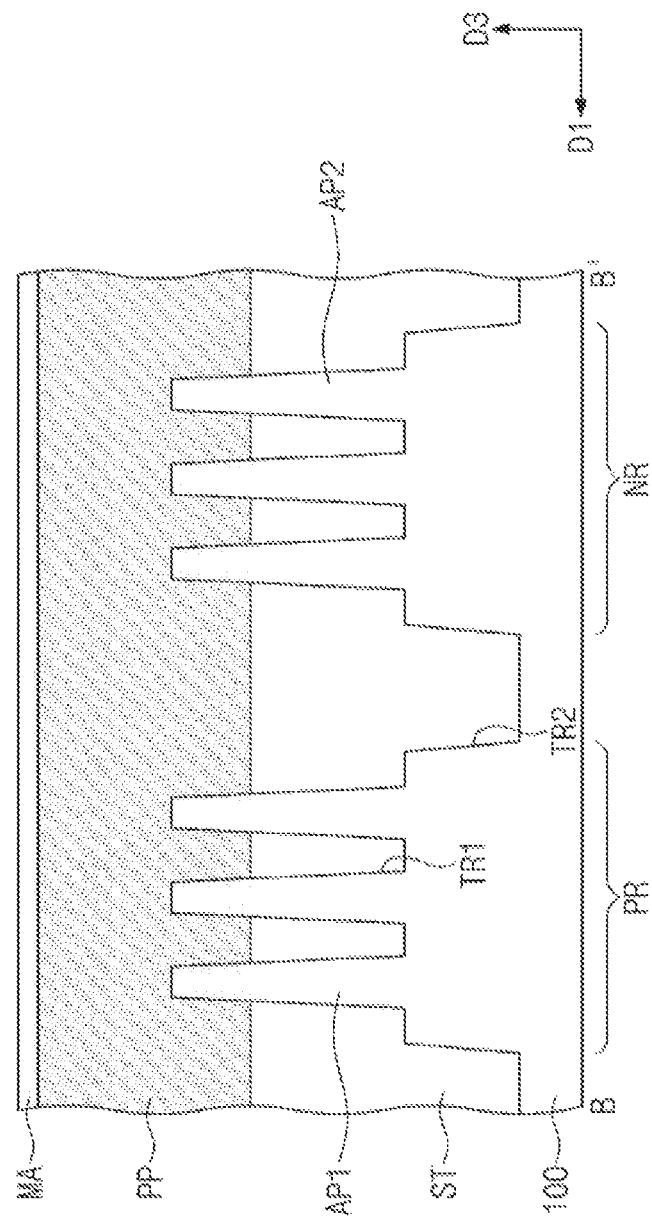
FIGS. 8B, 10B, 12B, and 14B are sectional views taken along lines B-B' of FIGS. 7, 9, 11, and 13, respectively.
Figure 9:
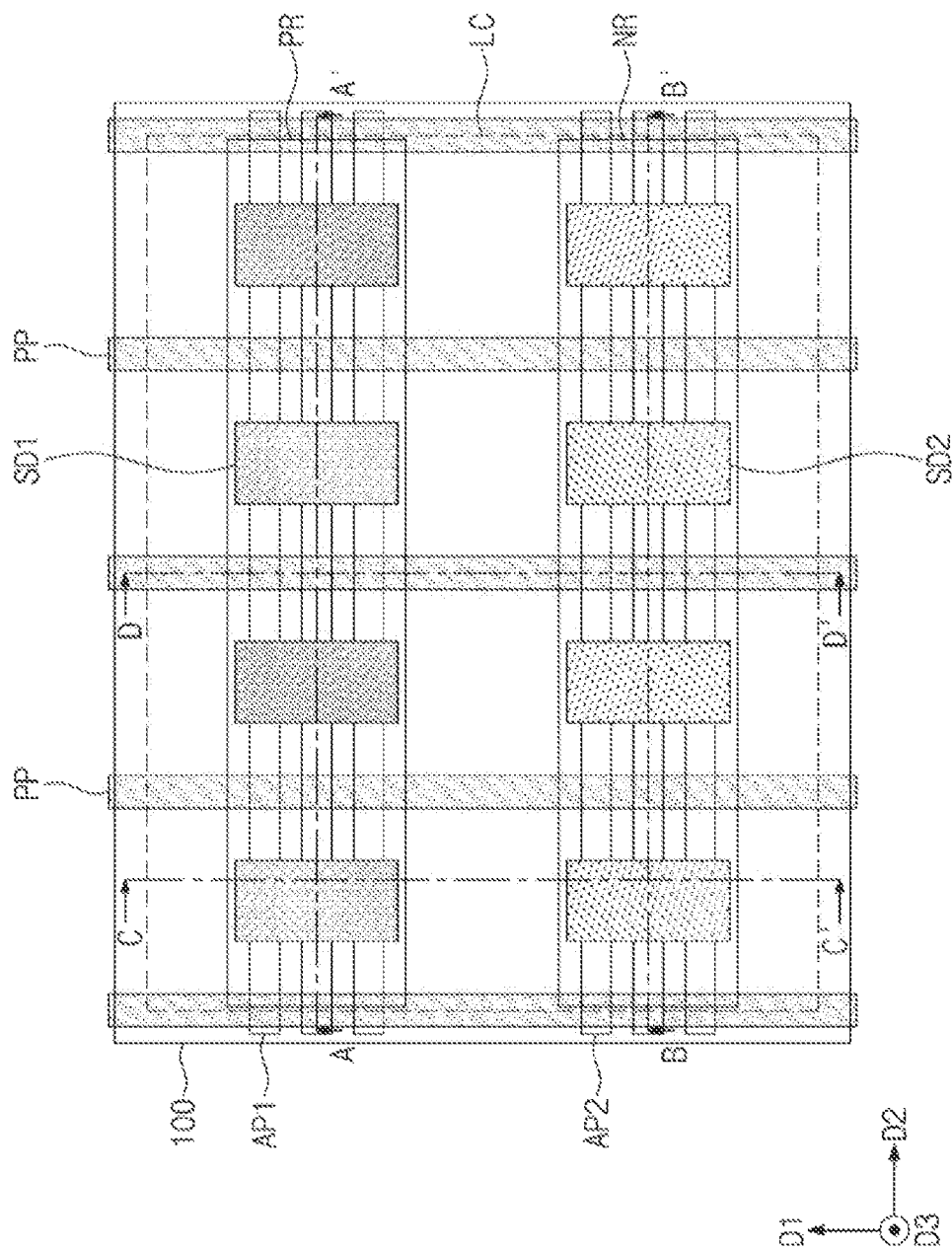

Referring to FIGS. 7, 8A, and 8B, sacrificial patterns PP may be formed to cross the first and second active patterns AP1 and AP2. The sacrificial patterns PP may be formed to have a line or bar shape extending in the first direction D1. The sacrificial patterns PP may be formed such that they are arranged in the second direction D2 and are spaced apart from each other at a constant pitch.

In detail, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include poly silicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. In an embodiment, the gate spacer layer may be formed of or include at least one of SiCN, SiCON, or SiN. In certain embodiments, the gate spacer layer may be a multi-layer structure including at least two of SiCN, SiCON, or SiN layers.

Referring to FIGS. 9 and 10A to 10D, the first source/drain patterns SD1 may be formed in an upper portion of the first active pattern AP1. A pair of the first source/drain patterns SD1 may be formed at both sides of each of the sacrificial patterns PP.

In detail, first recess regions RSR1 may be formed by etching the upper portion of the first active pattern AP1 using the hard mask patterns MA and the gate spacers GS as an etch mask. The device isolation layer ST between the first active patterns AP1 may be recessed during the etching of the upper portion of the first active pattern AP1 (e.g., see FIG. 10C).

The first source/drain pattern SD1 may be formed by performing a selective epitaxial growth process using an inner side surface of the first recess region RSR1 of the first active pattern AP1 as a seed layer. As a result of the formation of the first source/drain patterns SD1, the first channel pattern CH1 may be defined between each pair of the first source/drain patterns SD1. In an embodiment, the selective epitaxial growth process may include a chemical vapor deposition (CVD) process or a molecular beam epitaxy (MBE) process. The first source/drain patterns SD1 may include a semiconductor element (e.g., SiGe), whose lattice constant is larger than a lattice constant of a semiconductor element in the substrate 100. Each of the first source/drain patterns SD1 may be a multi-layer structure including a plurality of semiconductor layers.

In an embodiment, the first source/drain patterns SD1 may be doped in situ during a selective epitaxial growth process. In certain embodiments, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed on the second active pattern AP2. A pair of the second source/drain patterns SD2 may be formed at both sides of each of the sacrificial patterns PP.

In detail, second recess regions RSR2 may be formed by etching an upper portion of the second active pattern AP2 using the hard mask patterns MA and the gate spacers GS as an etch mask. The second source/drain pattern SD2 may be formed by performing a selective epitaxial growth process using an inner side surface of the second recess region RSR2 of the second active pattern AP2 as a seed layer. As a result of the formation of the second source/drain patterns SD2, the second channel pattern CH2 may be defined between each pair of the second source/drain patterns SD2. In an embodiment, the second source/drain patterns SD2 may include the same semiconductor element (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. That is, the second source/drain patterns SD2 of the first source/drain patterns SD1 may not be formed at the same time.

Referring to FIGS. 11 and 12A to 12D, the first interlayer insulating layer 110 may be formed to cover the first and second source/drain patterns SD1 and SD2, the hard mask patterns MA, and the gate spacers GS. In an embodiment, the first interlayer insulating layer 110 may be formed of or include silicon oxide.

The first interlayer insulating layer 110 may be planarized to expose the top surfaces of the sacrificial patterns PP. The planarization of the first interlayer insulating layer 110 may be performed using an etch-back or chemical mechanical polishing (CMP) process. In an embodiment, the planarization process may be performed to fully remove the hard mask patterns MA. Accordingly, the first interlayer insulating layer 110 may have a top surface that is coplanar with the top surfaces of the sacrificial patterns PP and the top surfaces of the gate spacers GS.

The sacrificial patterns PP may be replaced with the gate electrodes GE, respectively. For example, the exposed sacrificial patterns PP may be selectively removed. As a result of the removal of the sacrificial patterns PP, empty spaces may be formed. The gate insulating layer GI, the gate electrode GE, and the gate capping pattern GP may be formed in each of the empty spaces. The gate electrode GE may include a first metal pattern and a second metal pattern on the first metal pattern. The first metal pattern may be formed of a work function metal capable of adjusting a threshold voltage of a transistor, and the second metal pattern may be formed of a metallic material whose resistance is low.

The second interlayer insulating layer 120 may be formed on the first interlayer insulating layer 110. The second interlayer insulating layer 120 may be formed of or include silicon oxide. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the division structures DB may be formed along both sides of the logic cell LC, which are opposite to each other in the second direction D2. The division structures DB may be formed to overlap the gate electrodes GE, which are formed at both sides of the logic cell LC. For example, the formation of the division structures DB may include forming a hole, which is extended into the first and second active patterns AP1 and AP2 through the first and second interlayer insulating layers 110 and 120 and the gate electrode GE, and then filling the hole with an insulating layer.

Referring to FIGS. 13 and 14A to 14D, the third interlayer insulating layer 130 may be formed on the second interlayer insulating layer 120. The first metal layer M1 may be formed in the third interlayer insulating layer 130. The formation of the first metal layer M1 may include forming the first lower interconnection lines LIL1, the second lower interconnection lines LIL2, and the lower vias VI.

The etch stop layer ESL may be formed on the first metal layer M1. The fourth interlayer insulating layer 140 may be formed on the etch stop layer ESL. Interconnection holes UIH may be formed by patterning the fourth interlayer insulating layer 140. The interconnection holes UIH may be formed using a photolithography process.

Each of the interconnection holes UIH may include the line trench LTR and the via hole VIH. The line trench LTR may be formed by recessing an upper portion of the fourth interlayer insulating layer 140. The via hole VIH, which is vertically extended from the line trench LTR toward the first metal layer M1, may be formed by additionally performing an etching process on the line trench LTR. The via hole VIH may be formed to partially expose the top surface of the lower interconnection line LIL1 or LIL2.

Referring back to FIGS. 1 and 2A to 2D, the upper interconnection lines UIL may be formed by filling the interconnection holes UIH with a conductive material. In detail, the formation of the upper interconnection line UIL may include forming the via structure VCS in the interconnection hole UIH and forming the line structure FMS on the via structure VCS to fill the line trench LTR. The upper interconnection lines UIL according to the present embodiment may be formed by a dual damascene process.

A method of forming the upper interconnection line UIL according to an embodiment of the inventive concept will be described in more detail with reference to FIGS. 15 to 17.

Referring to FIG. 15, the via hole VIH, which is extended from the line trench LTR toward the second lower interconnection line LIL2, may be formed. The line trench LTR and the via hole VIH may constitute a single hole (i.e., the interconnection hole UIH). In an embodiment, the line trench LTR may be formed before the formation of the via hole VIH. In another embodiment, the via hole VIH may be formed before the formation of the line trench LTR. The via hole VIH may be formed to penetrate the etch stop layer ESL. Accordingly, a top surface LILt of the second lower interconnection line LIL2, which is covered with the etch stop layer ESL, may be exposed through the via hole VIH.

Referring to FIG. 16, the via portion VIP filling the via hole VIH may be selectively deposited on the top surface LILt of the second lower interconnection line LIL2. The via portion VIP may be formed by a process of selectively depositing a metal precursor on the second lower interconnection line LIL2 (i.e., a metal pattern), while inhibiting deposition of the metal precursor on the fourth interlayer insulating layer 140. Accordingly, the metal precursor, which is used to form the via portion VIP, may not be deposited on an inner surface ISW1 of the via hole VIH (i.e., on the fourth interlayer insulating layer 140). That is, the via portion VIP may be grown from the top surface LILt of the second lower interconnection line LIL2 in the third direction D3, when the via portion VIP is formed.

In an embodiment, the selective deposition of the via portion VIP may include controlling a process condition for the deposition process. For example, the deposition process of the via portion VIP may be performed under relatively low pressure. In the deposition process of the via portion VIP, the process condition may be controlled such that a deposition rate is higher on a metal pattern than on a silicon insulating layer. The deposition process of the via portion VIP may include repeating steps of depositing and etching a metal layer, and in this case, the via portion VIP may be selectively deposited on only the top surface LILt of the second lower interconnection line LIL2.

In an embodiment, the selective deposition of the via portion VIP may include providing an inhibitor on an inner surface of the interconnection hole UIH (i.e., a surface of the fourth interlayer insulating layer 140). The inhibitor may be selectively adsorbed on a silicon insulating layer, but not on a metal pattern, such as the second lower interconnection line LIL2. A metal deposition inhibition layer, which is formed by the adsorption of the inhibitor, may be a monolayer or a layer having a thickness of 1 nm or smaller. The metal deposition inhibition layer may impede/prevent a metal precursor, which is used to form the via portion VIP, from being adsorbed on a top surface thereof. As a result, the via portion VIP may be deposited on only the top surface LILt of the second lower interconnection line LIL2.

Since the via portion VIP is formed in such a manner that it is grown on the second lower interconnection line LIL2 in the third direction D3, the via portion VIP may have an upper portion protruding in the third direction D3 (i.e., the protruding portion PTP). The protruding portion PTP may fill at least a region of the line trench LTR.

The via portion VIP may be formed of or include a metallic material (e.g., molybdenum (Mo), ruthenium (Ru), tungsten (W), cobalt (Co), or a binary metal provided as a combination thereof), which can be directly formed on the fourth interlayer insulating layer 140 without a barrier metal therebetween.

Referring to FIG. 17, the barrier portion BAP may be uniformly formed on the via portion VIP. The barrier portion BAP may be formed by a uniform deposition process, which is performed in a uniform manner, not by a selective deposition process, which is selectively performed on a metal pattern. The barrier portion BAP may be deposited on not only a top surface of the via portion VIP but also an inner surface ISW2 of the line trench LTR (i.e., the surface of the fourth interlayer insulating layer 140). The barrier portion BAP may be deposited by a conformal CVD process.

In an embodiment, the deposition of the barrier portion BAP may include changing a process condition for the process of depositing the via portion VIP. For example, the deposition process of the via portion VIP may be first performed, and then, the deposition process of the barrier portion BAP may be performed under a relatively high pressure condition. In other words, by changing the process condition for the deposition process of the via portion VIP (i.e., the selective deposition process), it may be possible to successively perform the deposition process of the barrier portion BAP (i.e., the uniform deposition process). The process condition for the deposition process of the barrier portion BAP may be controlled such that a deposition rate on a metal pattern has a value similar to a deposition rate on a silicon insulating layer.

In an embodiment, the deposition of the barrier portion BAP may include selectively removing the metal deposition inhibition layer on the inner surface of the interconnection hole UIH. In the case where the deposition process of the barrier portion BAP is performed after removing the metal deposition inhibition layer described above, the barrier portion BAP may also be deposited on the inner surface ISW2 of the line trench LTR (i.e., the surface of the fourth interlayer insulating layer 140).

In an embodiment, a nitrogen doping process may be performed during or after the deposition of the barrier portion BAP. As an example, nitrogen (N) may be supplied as a source material during the deposition process of the barrier portion BAP and in this case, the nitrogen doping process may be performed in an in-situ manner. As another example, a nitrogen ion implantation process may be performed on the barrier portion BAP after the deposition process of the barrier portion BAP. The ion implantation process may be performed using plasma.

Since the nitrogen injection process is performed on the barrier portion BAP, the barrier portion BAP may have a nitrogen concentration higher than the via portion VIP, as described with reference to FIG. 4. As a result, the barrier portion BAP may be formed to contain nitrogen (N) atoms, and in this case, the barrier portion BAP may be used as a barrier pattern of more effectively impeding/preventing a metal issue in the line structure FMS, which will be formed in a subsequent step. By contrast, the via portion VIP may be formed such that it does not contain any nitrogen (N), and in this case, it may be possible to control an electrical resistance of the via portion VIP to a low value and to improve a contact plug property of the via portion VIP. However, in an embodiment, the afore-described nitrogen injection process on the barrier portion BAP may be omitted.

The barrier portion BAP may be formed on the via portion VIP to cover the inner surface ISW2 of the line trench LTR. The barrier portion BAP may also be formed to cover the bottom BOT of the line trench LTR. The barrier portion BAP may be formed of the same metallic material as the via portion VIP. Thus, the barrier portion BAP, together with the via portion VIP, may constitute the via structure VCS which is provided as a single object.

As the distance to the via portion VIP is decreased, the thickness of the barrier portion BAP may be gradually increased. As previously described with reference to FIG. 3, the barrier portion BAP may have the first thickness T1 at a position, which is relatively far from the via portion VIP, the third thickness T3 at a position, which is relatively close to the via portion VIP, and the second thickness T2 at a position therebetween. The second thickness T2 may be larger than the first thickness T1, and the third thickness T3 may be larger than the second thickness T2. In the case where a deposition rate of the barrier portion BAP is higher on the via portion VIP than on the fourth interlayer insulating layer 140, the barrier portion BAP may have a thickness increasing in a direction toward the via portion VIP, as described above.

Referring back to FIG. 3, the line structure FMS may be formed on the barrier portion BAP. The formation of the line structure FMS may include conformally forming the first conductive layer MEP1 on the barrier portion BAP and forming the second conductive layer MEP2 on the first conductive layer MEP1. The first and second conductive layers MEP1 and MEP2 may be formed of or include different metallic materials that are selected from the group consisting of copper (Cu), cobalt (Co), ruthenium (Ru), tungsten (W), molybdenum (Mo), aluminum (Al), silver (Ag), and gold (Au). For example, the first conductive layer MEP1 may be formed of or include cobalt (Co), and the second conductive layer MEP2 may be formed of or include copper (Cu).

Figure 18:
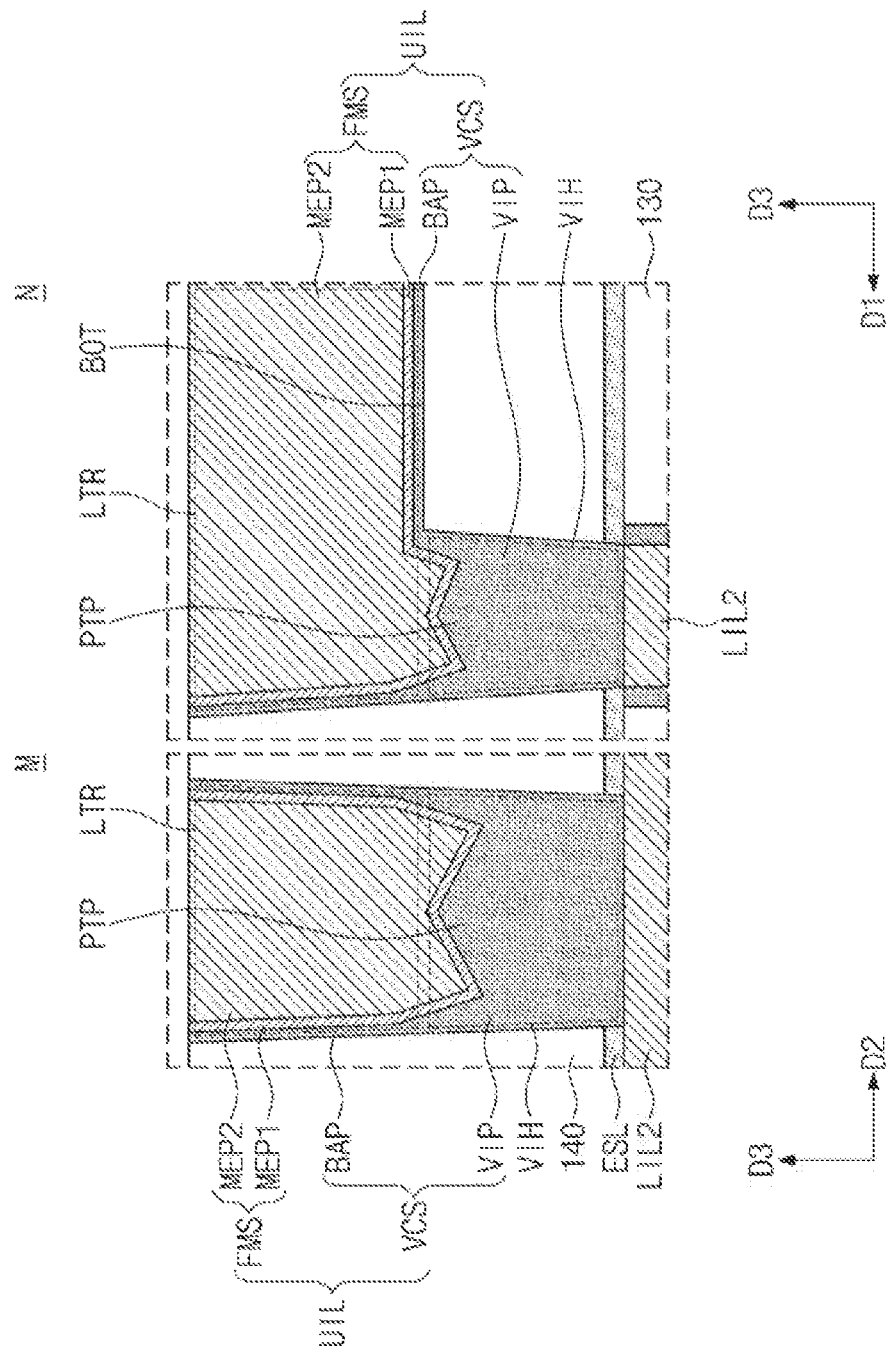
FIGS. 18 to 20 are sectional views, each of which illustrates portions (e.g., the portion M of FIG. 2A and the portion N of FIG. 2C) of a semiconductor device according to an embodiment of the inventive concept.
Figure 19:
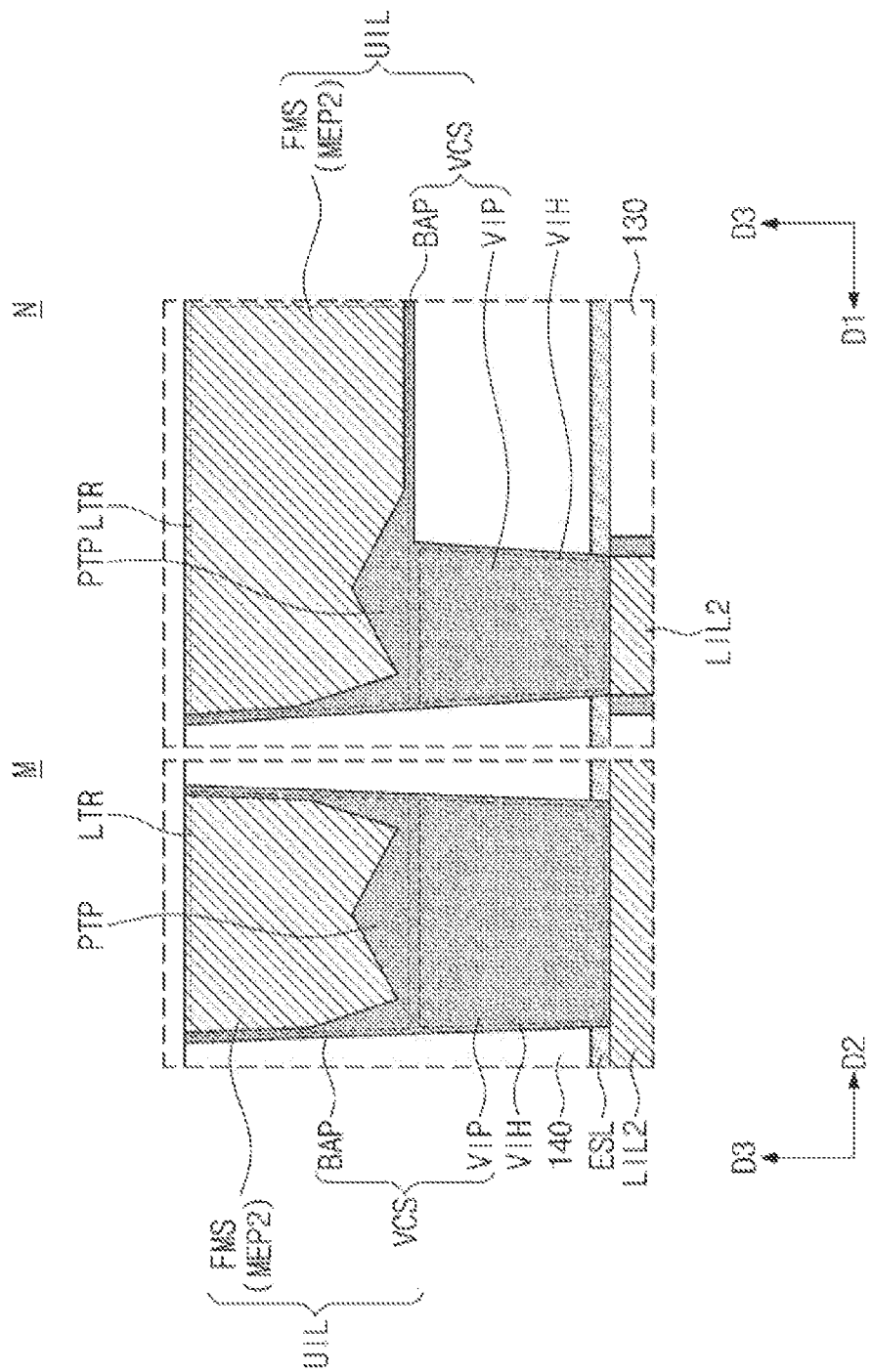
Figure 20:
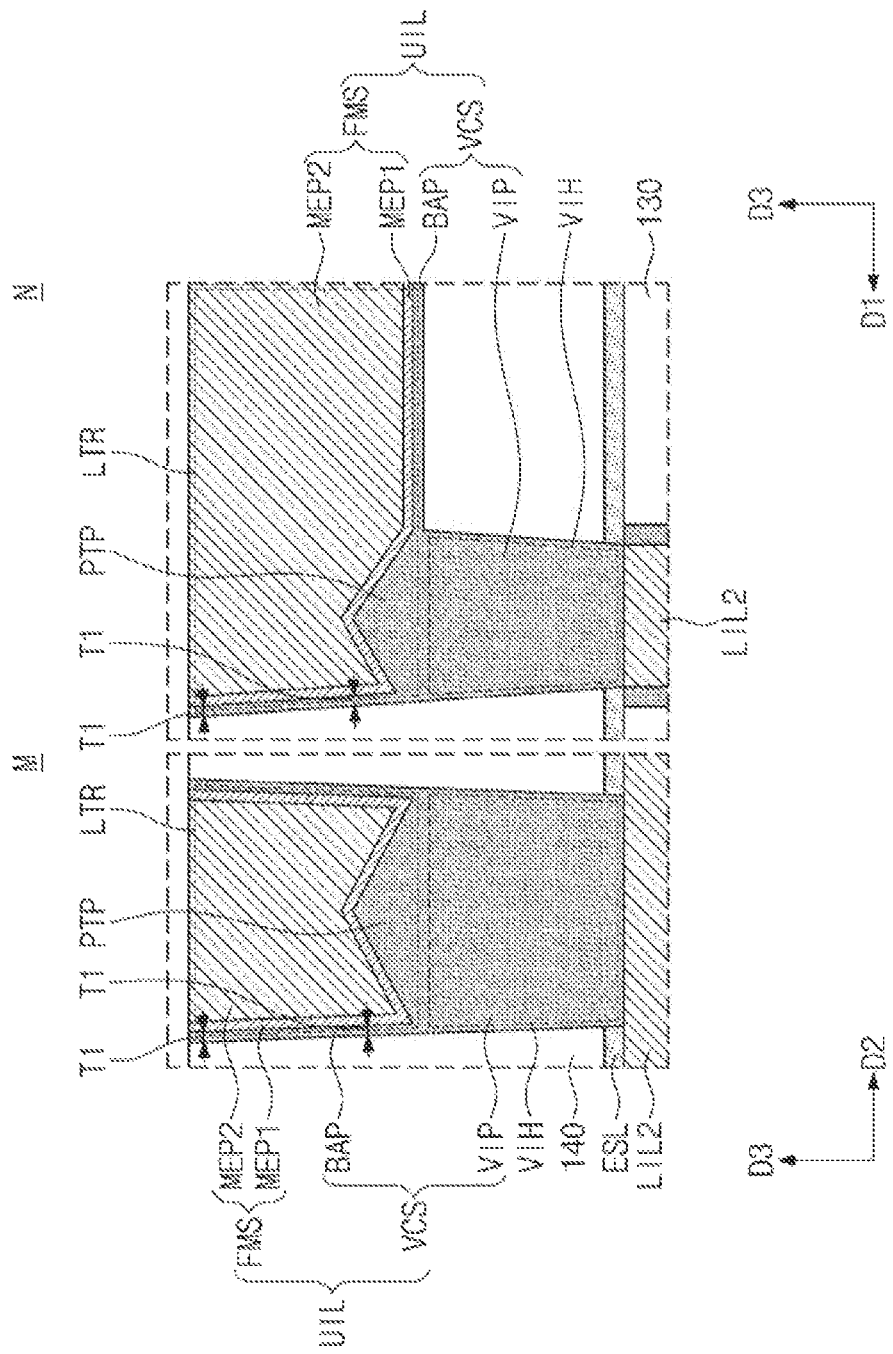

FIGS. 18 to 20 are sectional views, each of which illustrates portions (e.g., the portion M of FIG. 2A and the portion N of FIG. 2C) of a semiconductor device according to an embodiment of the inventive concept. In the following description, an element previously described with reference to FIGS. 1, 2A to 2D, and 3 may be identified by the same reference number without repeating an overlapping description thereof, for the sake of brevity.

Referring to FIG. 18, the via portion VIP of the via structure VCS may not fill a portion (e.g., an upper portion) of the via hole VIH. A lower portion of the line structure FMS may fill the upper portion of the via hole VIH, which is not filled with the via portion VIP. That is, at least a portion of the line structure FMS may extend into the via hole VIH. The uppermost portion of the protruding portion PTP may be located at a level that is lower than the bottom BOT of the line trench LTR.

Referring to FIG. 19, the line structure FMS may include only the second conductive layer MEP2. That is, the first conductive layer MEP1 previously described with reference to FIG. 3 may be omitted from the line structure FMS according to the present embodiment. In an embodiment, the line structure FMS may include a copper (Cu) pattern that is directly formed on the barrier portion BAP.

Referring to FIG. 20, the barrier portion BAP may have a substantially uniform thickness, regardless of whether or not it is located adjacent to the via portion VIP. For example, an upper portion of the barrier portion BAP that is in an upper region of the line trench LTR may have the first thickness T1. A lower portion of the barrier portion BAP that is in a lower region of the line trench LTR and/or adjacent to the via portion VIP may also have the first thickness T1.

Figure 21:
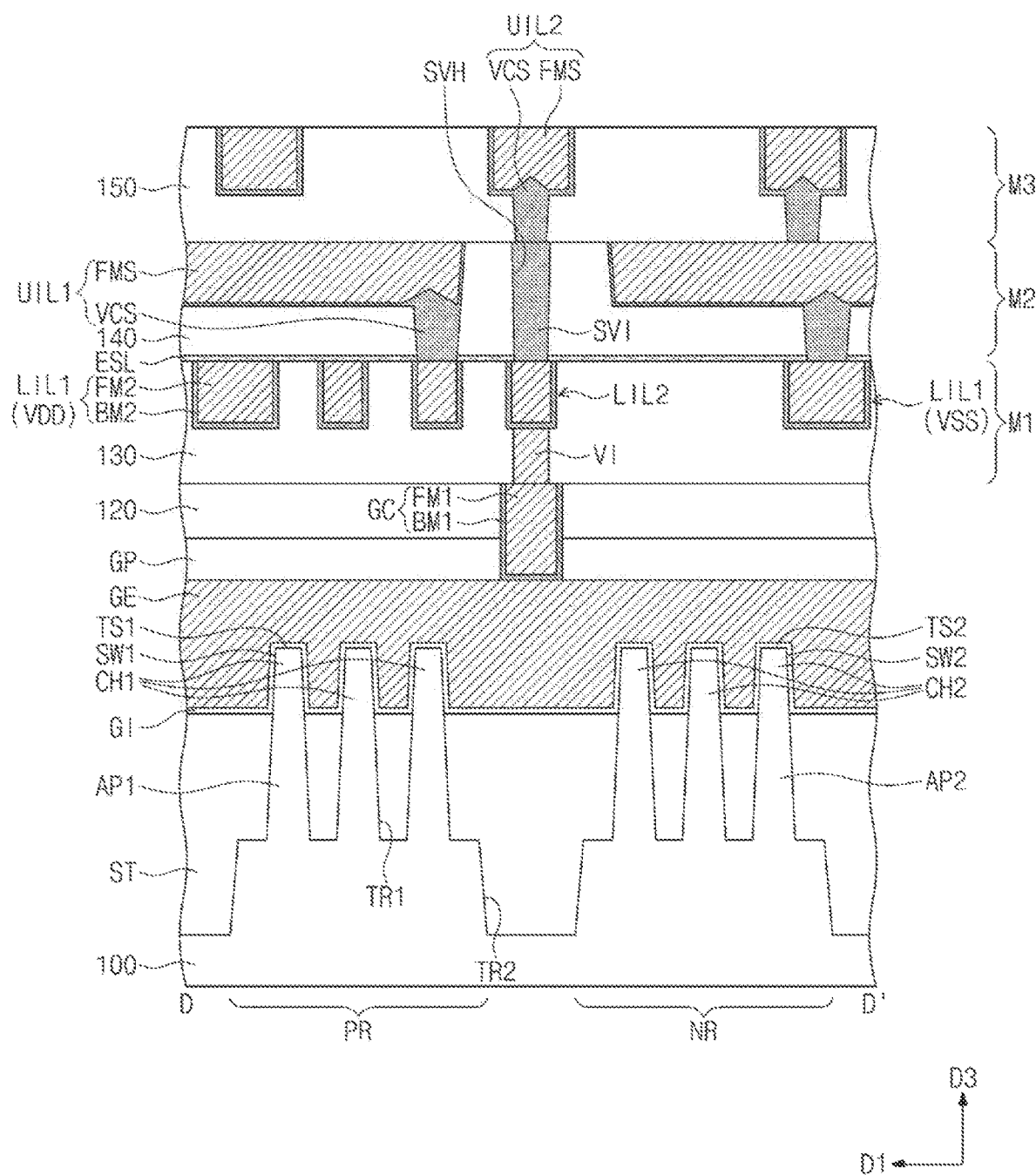
FIG. 21 is a sectional view, which is taken along the line D-D' of FIG. 1 to illustrate a semiconductor device according to an embodiment of the inventive concept.

FIG. 21 is a sectional view, which is taken along the line D-D' of FIG. 1 to illustrate a semiconductor device according to an embodiment of the inventive concept. In the following description, an element previously described with reference to FIGS. 1, 2A to 2D, and 3 may be identified by the same reference number without repeating an overlapping description thereof, for the sake of brevity.

Referring to FIG. 21, the second metal layer M2 may include first upper interconnection lines UIL1 and a super via SVI. Each of the first upper interconnection lines UIL1 may be configured to have substantially the same features as the upper interconnection line UIL previously described with reference to FIGS. 1, 2A to 2D, and 3.

The super via SVI may be provided to penetrate the fourth interlayer insulating layer 140. The super via SVI may be extended from a top surface of the fourth interlayer insulating layer 140 to a top surface of the second lower interconnection line LIL2. The super via SVI may be formed of or include the same material as the via structure VCS of the first upper interconnection line UIL1. A diameter of the super via SVI may be smaller than a diameter of the via structure VCS.

The super via SVI and the via structure VCS may be formed at the same time. Since, unlike the via structure VCS, the super via SVI does not need to fill the line trench LTR, the super via SVI may completely fill a super via hole SVH penetrating the fourth interlayer insulating layer 140.

A third metal layer M3 may be provided on the second metal layer M2. The third metal layer M3 may be provided in a fifth interlayer insulating layer 150. The third metal layer M3 may include second upper interconnection lines UIL2. The second upper interconnection line UIL2 may also include a via structure VCS and a line structure FMS on the via structure VCS. The via structure VCS of at least one of the second upper interconnection lines UIL2 may be connected to the super via SVI. Accordingly, the at least one of the second upper interconnection lines UIL2 may be electrically connected to the second lower interconnection line LIL2 in the vertical third direction D3.

FIGS. 22A to 22D are sectional views, which are respectively taken along lines A-A', B-B', C-C' and D-D' of FIG. 1 to illustrate a semiconductor device according to an embodiment of the inventive concept. In the following description, an element previously described with reference to FIGS. 1 and 2A to 2D may be identified by the same reference number without repeating an overlapping description thereof, for the sake of brevity.

Referring to FIGS. 1 and 22A to 22D, the substrate 100 including the first and second active regions PR and NR may be provided. The device isolation layer ST may be provided on the substrate 100. The device isolation layer ST may define the first and second active patterns AP1 and AP2 in an upper portion of the substrate 100. The device isolation layer ST may fill the trench TR between the first and second active patterns AP1 and AP2. The first and second active patterns AP1 and AP2 may be defined on the first and second active regions PR and NR, respectively.

The first active pattern AP1 may include the first channel patterns CH1, which are vertically stacked. The stacked first channel patterns CH1 may be spaced apart from each other in the third direction D3. The stacked first channel patterns CH1 may be vertically overlapped with each other. The second active pattern AP2 may include the second channel patterns CH2, which are vertically stacked. The stacked second channel patterns CH2 may be spaced apart from each other in the third direction D3. The stacked second channel patterns CH2 may vertically overlap each other. The first and second channel patterns CH1 and CH2 may be formed of or include at least one of silicon (Si), germanium (Ge), or silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect each adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect each adjacent pair of the second source/drain patterns SD2 to each other.

The gate electrodes GE may be provided to cross the first and second channel patterns CH1 and CH2 and to extend in the first direction D1. The gate electrode GE may vertically overlap the first and second channel patterns CH1 and CH2. A pair of the gate spacers GS may be disposed on opposite side surfaces of the gate electrode GE. The gate capping pattern GP may be provided on the gate electrode GE.

Figure 22A:
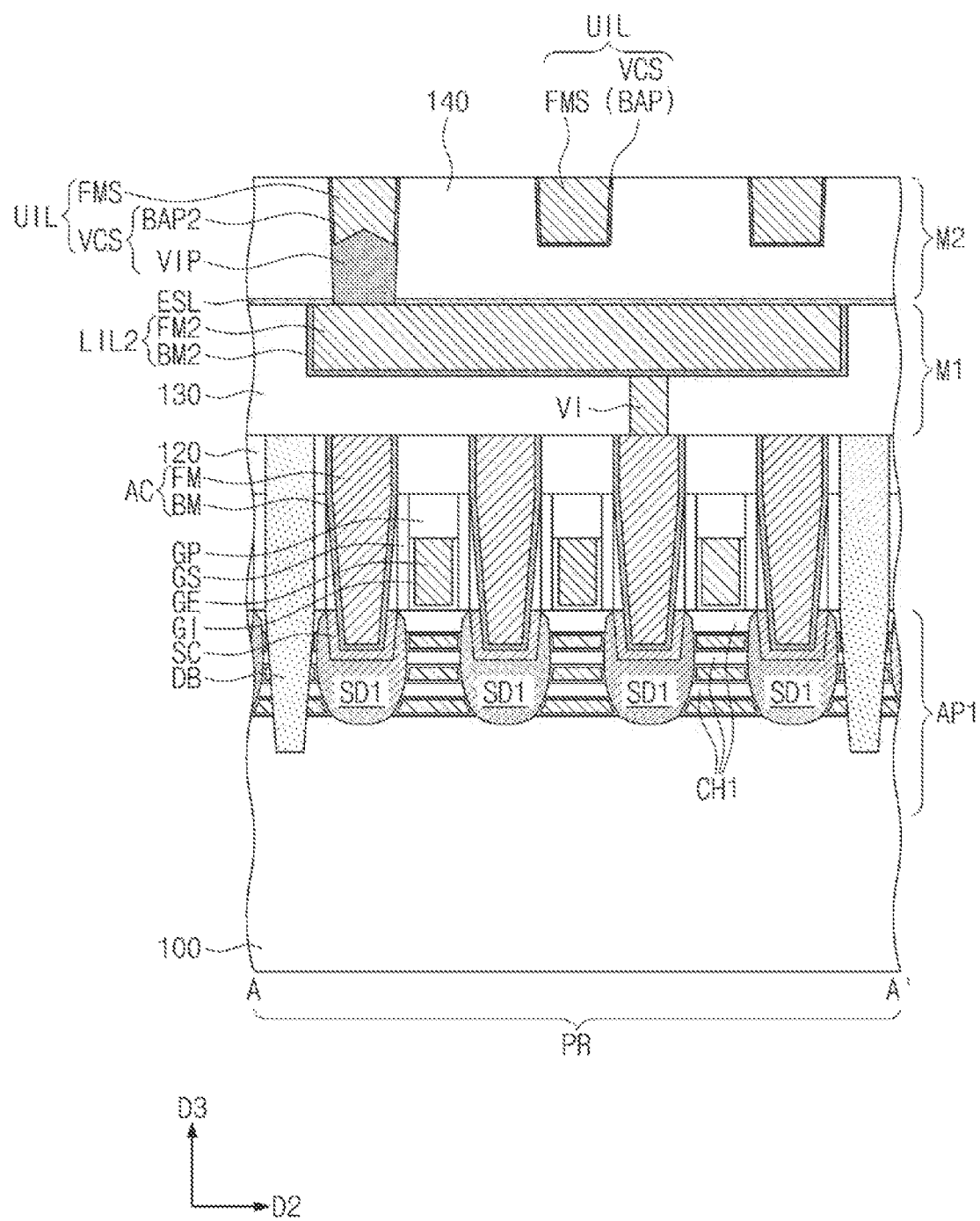
FIGS. 22A to 22D are sectional views, which are respectively taken along lines A-A', B-B', C-C' and D-D' of FIG. 1 to illustrate a semiconductor device according to an embodiment of the inventive concept.
Figure 22B:
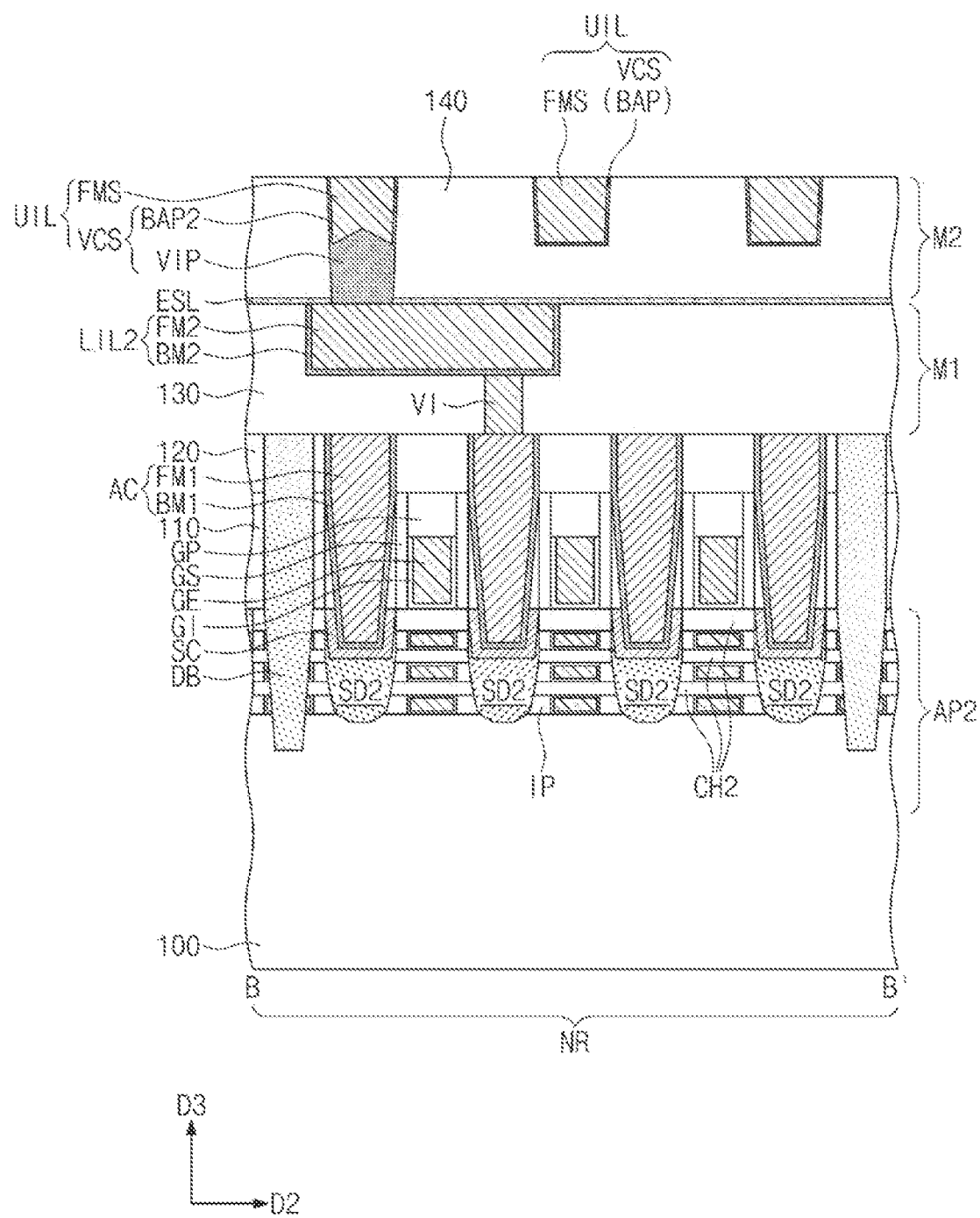
Figure 22C:
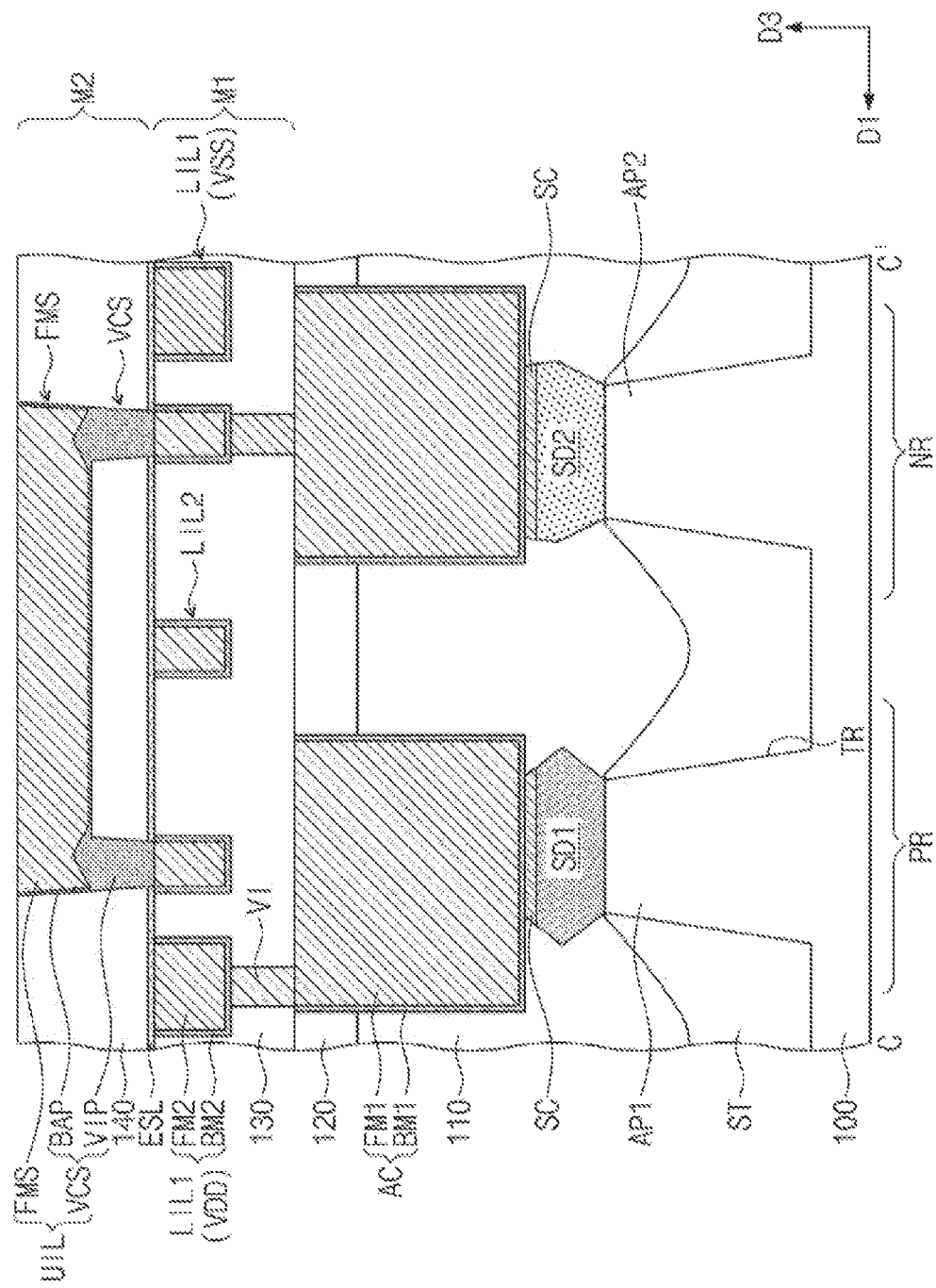
Figure 22D:
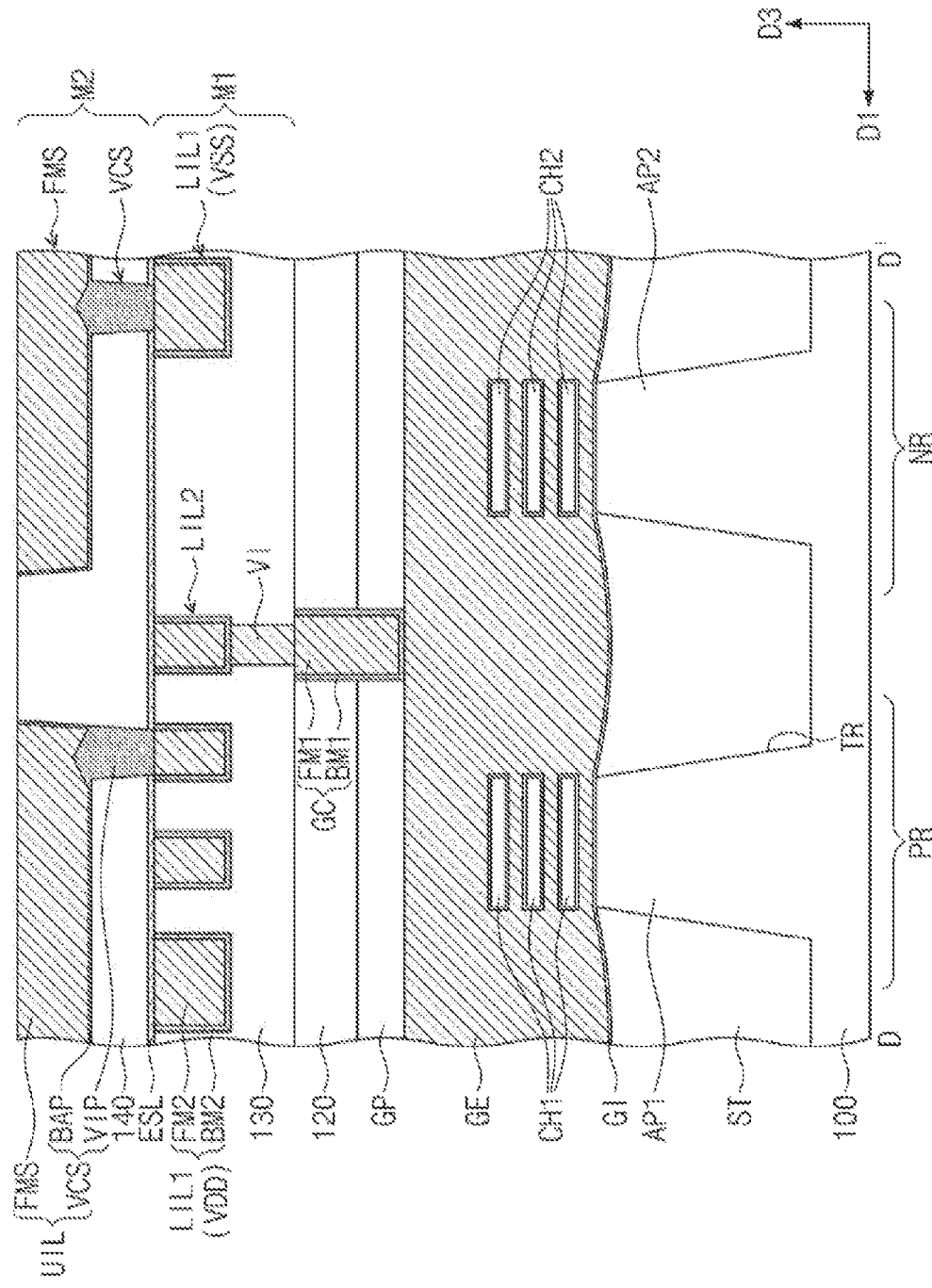

The gate electrode GE may be provided to surround each of the first and second channel patterns CH1 and CH2 (e.g., see FIG. 22D). For example, the gate electrode GE may be provided to face a top surface, a bottom surface, and opposite side surfaces of each of the first and second channel patterns CH1 and CH2. A transistor according to the present embodiment may be a three-dimensional field effect transistor (e.g., MBCFET or GAAFET) in which the gate electrode GE is provided to three-dimensionally surround the channel pattern CH1 or CH2.

The gate insulating layer GI may be provided between each of the first and second channel patterns CH1 and CH2 and the gate electrode GE. The gate insulating layer GI may be provided to surround each of the first and second channel patterns CH1 and CH2.

On the second active region NR, an insulating pattern IP may be interposed between the gate insulating layer GI and the second source/drain pattern SD2. The gate electrode GE may be spaced apart from the second source/drain pattern SD2 by the gate insulating layer GI and the insulating pattern IP. In an embodiment, the insulating pattern IP may be omitted on the first active region PR.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. The gate contact GC may be provided to penetrate the second interlayer insulating layer 120 and the gate capping pattern GP and to be connected to the gate electrode GE.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be substantially the same as those in the previous embodiment described with reference to FIGS. 1, 2A to 2D, and 3.

Figure 23:
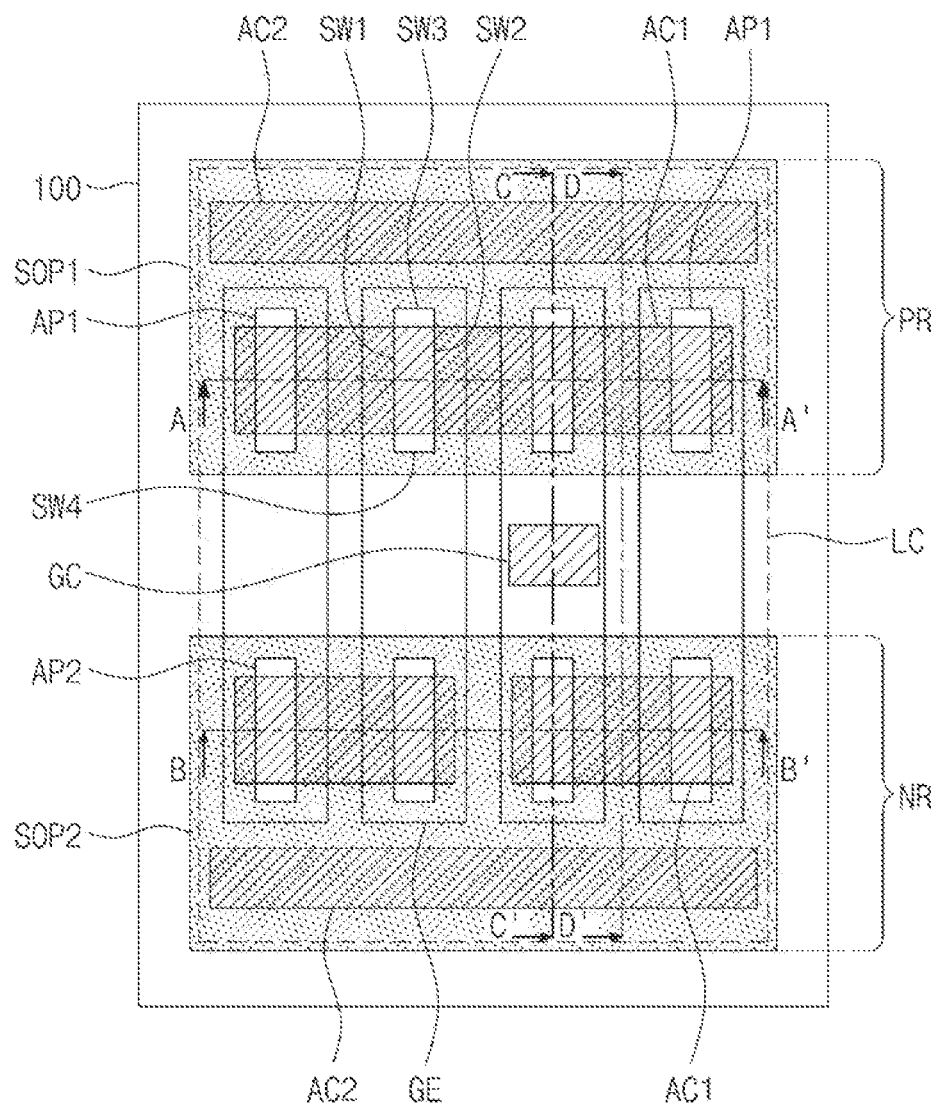
FIG. 23 is a plan view illustrating a semiconductor device according to an embodiment of the inventive concept.
Figure 23:
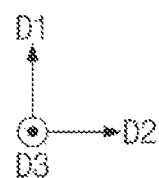
Figure 24A:
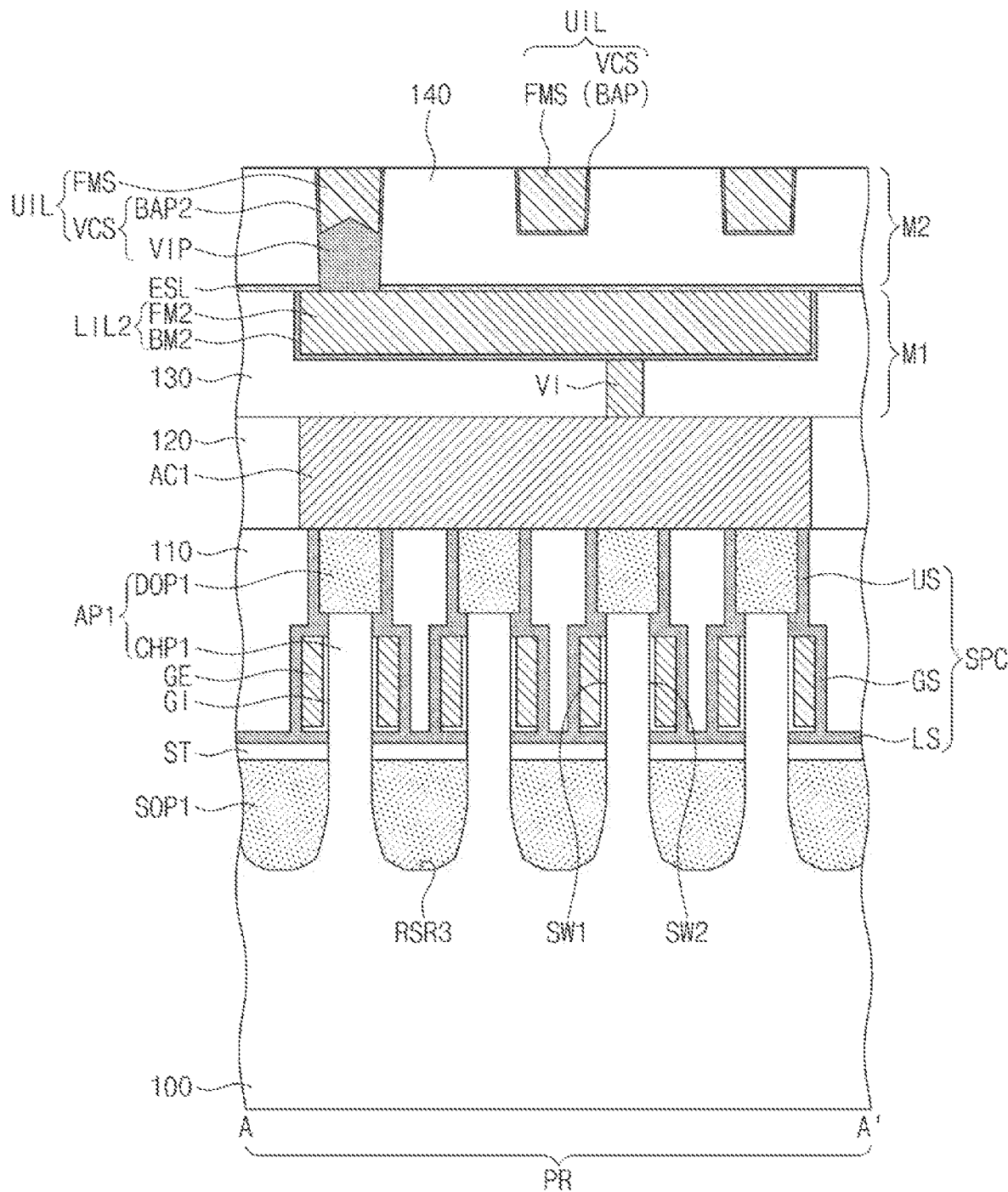
FIGS. 24A to 24D are sectional views taken along lines A-A', B-B', C-C' and D-D' of FIG. 23, respectively.
Figure 24B:
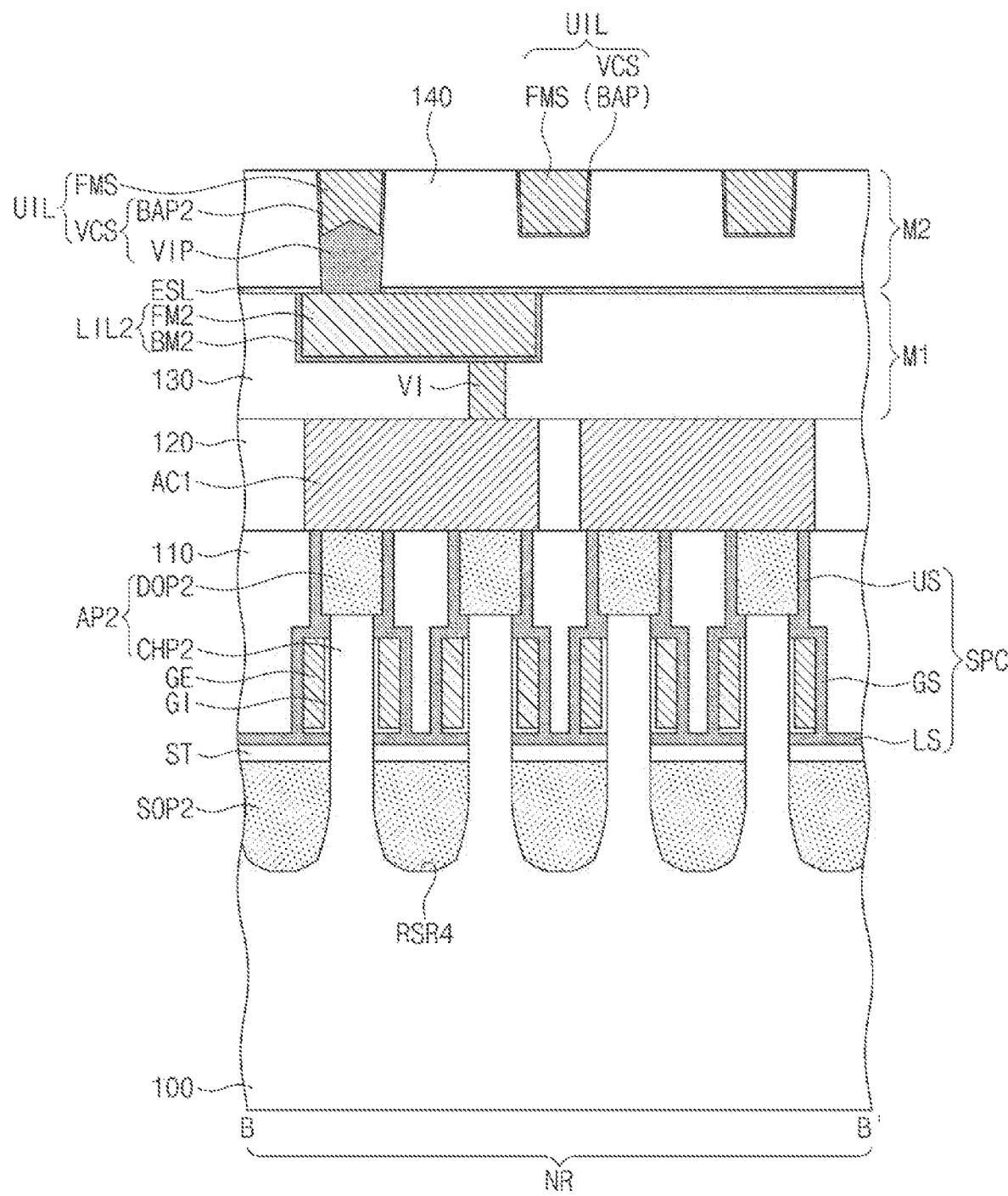
Figure 24C:
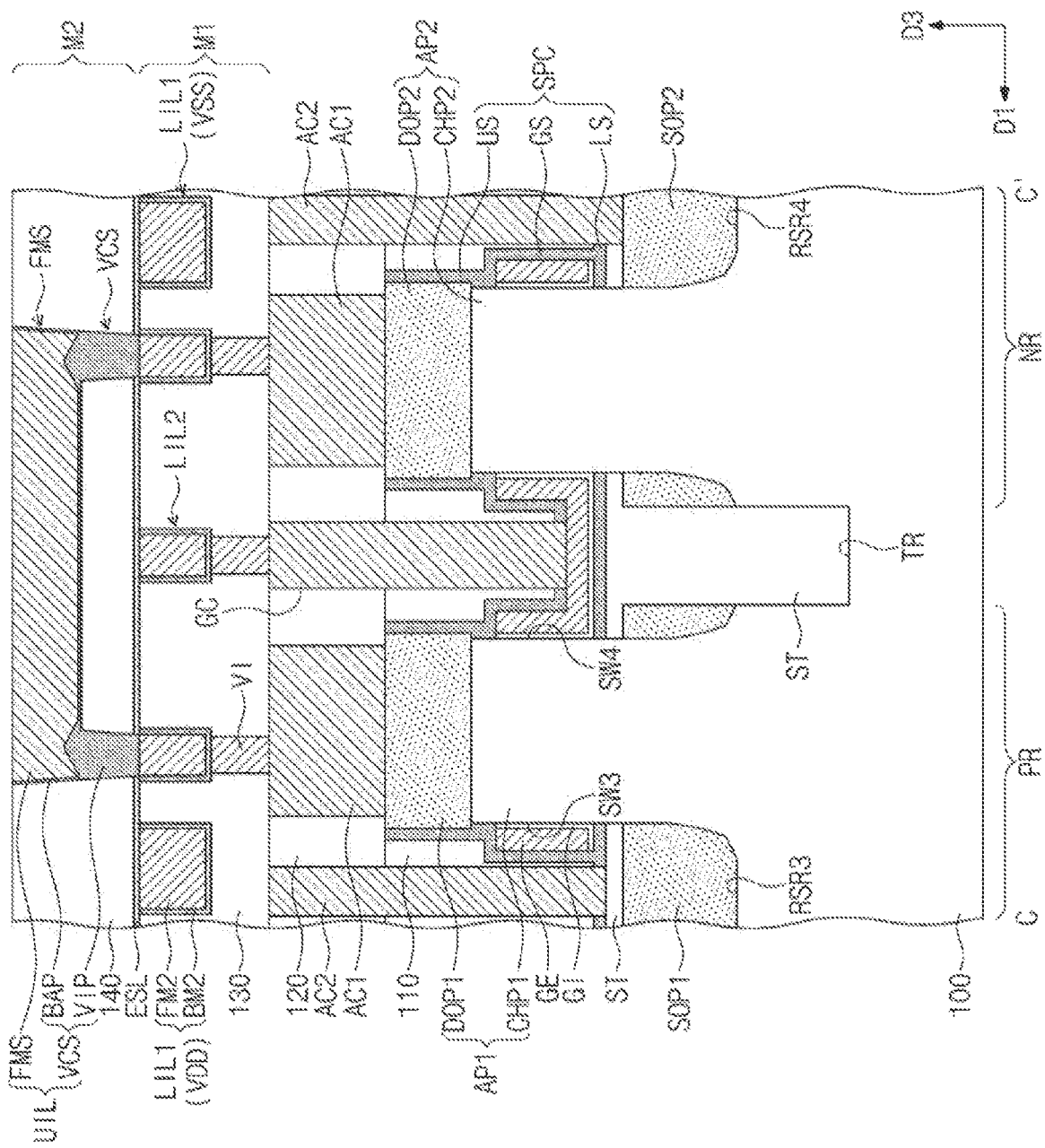
Figure 24D:
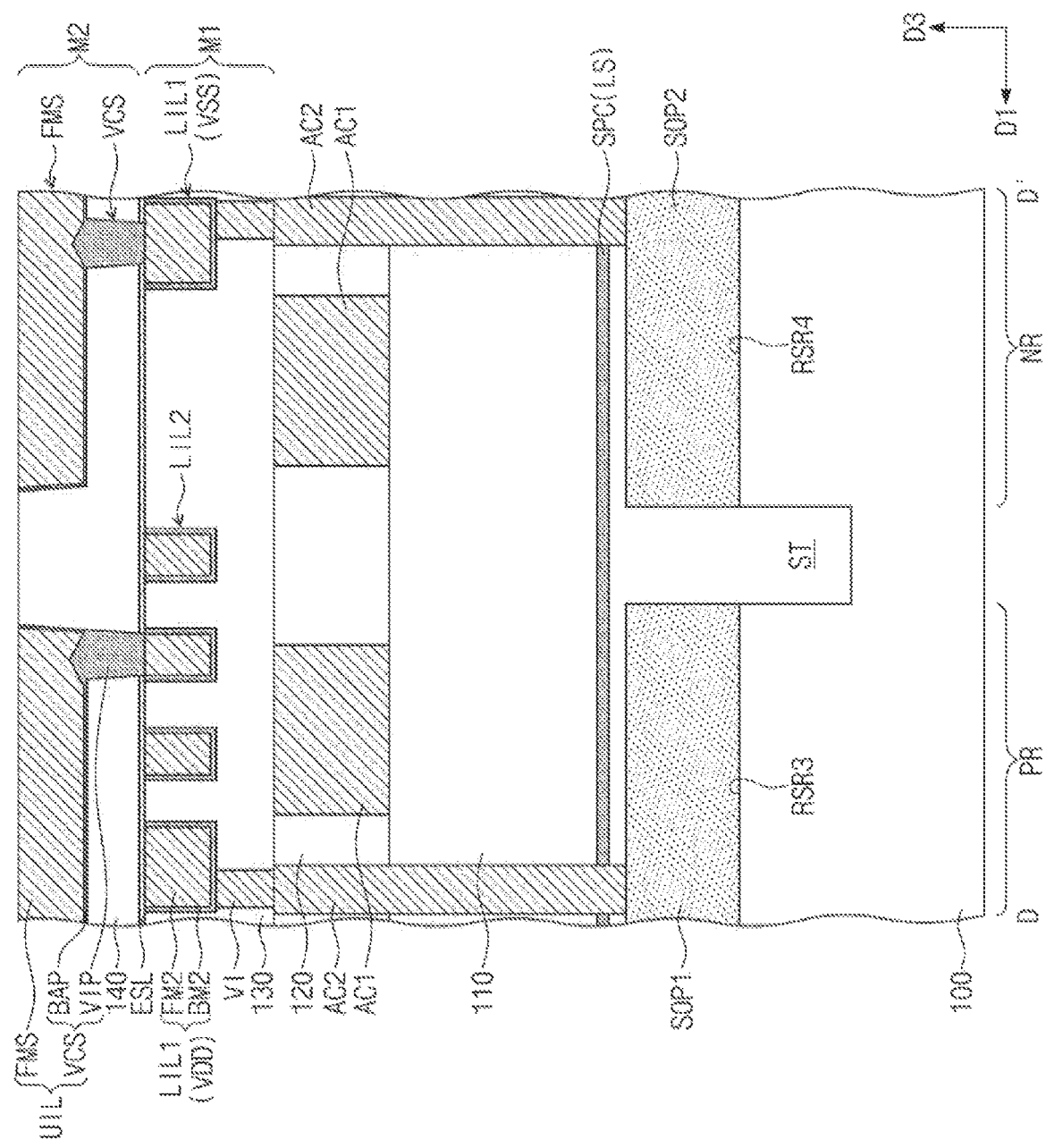

FIG. 23 is a plan view illustrating a semiconductor device according to an embodiment of the inventive concept. FIGS. 24A to 24D are sectional views taken along lines A-A', B-B', C-C' and D-D' of FIG. 23, respectively. In the following description, an element previously described with reference to FIGS. 1 and 2A to 2D may be identified by the same reference number without repeating an overlapping description thereof, for the sake of brevity.

Referring to FIGS. 23 and 24A to 24D, the logic cell LC may be provided on the substrate 100. The logic cell LC may include vertical-type transistors, which constitute the logic device, and interconnection lines, which connect the vertical-type transistors to each other.

The logic cell LC on the substrate 100 may include the first active region PR and the second active region NR. The first and second active regions PR and NR may be defined by a trench TR, which is formed in an upper portion of the substrate 100. The first and second active regions PR and NR may be spaced apart from each other in the first direction D1.

A first lower epitaxial pattern SOP1 may be provided on the first active region PR, and a second lower epitaxial pattern SOP2 may be provided on the second active region NR. When viewed in a plan view, the first lower epitaxial pattern SOP1 may overlap the first active region PR in the third direction D3, and the second lower epitaxial pattern SOP2 may overlap the second active region NR in the third direction D3. The first and second lower epitaxial patterns SOP1 and SOP2 may be epitaxial patterns that are formed by a selective epitaxial growth process. The first lower epitaxial pattern SOP1 may be provided in a third recess region RSR3 of the substrate 100, and the second lower epitaxial pattern SOP2 may be provided in a fourth recess region RSR4 of the substrate 100.

The first active patterns AP1 may be provided on the first active region PR, and the second active patterns AP2 may be provided on the second active region NR. Each of the first and second active patterns AP1 and AP2 may be a vertically-protruding fin pattern. When viewed in a plan view, each of the first and second active patterns AP1 and AP2 may be a bar-shaped pattern extending in the first direction D1. The first active patterns AP1 may be arranged in the second direction D2, and the second active patterns AP2 may be arranged in the second direction D2.

Each of the first active patterns AP1 may include a first channel pattern CHP1, which vertically protrudes from the first lower epitaxial pattern SOP1, and a first upper epitaxial pattern DOP1, which is provided on the first channel pattern CHP1. Each of the second active patterns AP2 may include a second channel pattern CHP2, which vertically protrudes from the second lower epitaxial pattern SOP2, and a second upper epitaxial pattern DOP2, which is provided on the second channel pattern CHP2.

The device isolation layer ST may be provided on the substrate 100 to fill the trench TR. The device isolation layer ST may cover top surfaces of the first and second lower epitaxial patterns SOP1 and SOP2. The first and second active patterns AP1 and AP2 may protrude vertically above the device isolation layer ST.

The gate electrodes GE may be provided on the device isolation layer ST and may be extended in the first direction D1 to be parallel to each other. The gate electrodes GE may be arranged in the second direction D2. The gate electrode GE may surround the first channel pattern CHP1 of the first active pattern AP1 and may surround the second channel pattern CHP2 of the second active pattern AP2. For example, the first channel pattern CHP1 of the first active pattern AP1 may have first to fourth side surfaces SW1 to SW4. The first and second side surfaces SW1 and SW2 may be opposite to each other in the second direction D2, and the third and fourth side surfaces SW3 and SW4 may be opposite to each other in the first direction D1. The gate electrode GE may be provided on the first to fourth side surfaces SW1 to SW4. For example, the gate electrode GE may enclose the first to fourth side surfaces SW1 to SW4.

The gate insulating layer GI may be interposed between the gate electrode GE and each of the first and second channel patterns CHP1 and CHP2. The gate insulating layer GI may cover bottom and inner side surfaces of the gate electrode GE. For example, the gate insulating layer GI may directly cover the first to fourth side surfaces SW1 to SW4 of the first active pattern AP1.

The first and second upper epitaxial patterns DOP1 and DOP2 may protrude vertically above the gate electrode GE. The top surface of the gate electrode GE may be lower than the bottom surface of each of the first and second upper epitaxial patterns DOP1 and DOP2. In other words, each of the first and second active patterns AP1 and AP2 may have a structure, which protrudes vertically from the substrate 100 and penetrates the gate electrode GE.

The semiconductor device according to the present embodiment may include vertical-type transistors, in which carriers move in the third direction D3. For example, in the case where the transistor is turned on by applying a voltage to the gate electrode GE, carriers may move from the lower epitaxial pattern SOP1 or SOP2 to the upper epitaxial pattern DOP1 or DOP2 through the channel pattern CHP1 or CHP2. In the present embodiment, the gate electrode GE may be provided to fully surround the side surfaces SW1 to SW4 of the channel pattern CHP1 or CHP2. In the present embodiment, a transistor may be a three-dimensional field effect transistor (e.g., VFET) having a gate-all-around structure. Since the gate electrode is provided to fully surround the channel pattern, the semiconductor device may have excellent electrical characteristics.

A spacer SPC may be provided on the device isolation layer ST to cover the gate electrodes GE and the first and second active patterns AP1 and AP2. The spacer SPC may contain a silicon nitride layer or a silicon oxynitride layer. The spacer SPC may include a lower spacer LS, an upper spacer US, and the gate spacer GS between the lower and upper spacers LS and US.

The lower spacer LS may directly cover the top surface of the device isolation layer ST. The gate electrodes GE may be spaced apart from the device isolation layer ST in the third direction D3 by the lower spacer LS. The gate spacer GS may cover the top and outer side surfaces of each of the gate electrodes GE. The upper spacer US may cover side surfaces of the first and second upper epitaxial patterns DOP1 and DOP2. However, the upper spacer US may not cover top surfaces of the first and second upper epitaxial patterns DOP1 and DOP2.

The first interlayer insulating layer 110 may be provided on the spacer SPC. The first interlayer insulating layer 110 may have a top surface that is substantially coplanar with the top surfaces of the first and second upper epitaxial patterns DOP1 and DOP2. The second to fourth interlayer insulating layers 120, 130, and 140 may be sequentially stacked on the first interlayer insulating layer 110. The second interlayer insulating layer 120 may cover the top surfaces of the first and second upper epitaxial patterns DOP1 and DOP2.

At least one first active contact AC1 may be provided to penetrate the second interlayer insulating layer 120 and to be coupled to the first and second upper epitaxial patterns DOP1 and DOP2. At least one second active contact AC2 may be provided to sequentially penetrate the second interlayer insulating layer 120, the first interlayer insulating layer 110, the lower spacer LS, and the device isolation layer ST and to be coupled to the first and second lower epitaxial patterns SOP1 and SOP2. The gate contact GC may be provided to sequentially penetrate the second interlayer insulating layer 120, the first interlayer insulating layer 110, and the gate spacer GS and to be coupled to the gate electrode GE. The first and second active contacts AC1 and AC2 and the gate contact GC may have top surfaces that are substantially coplanar with the top surface of the second interlayer insulating layer 120.

Each of the first active contacts AC1 may be extended in the second direction D2 and may be connected to at least one upper epitaxial pattern DOP1 or DOP2. Each of the second active contacts AC2 may be provided below and vertically overlapped by the first lower interconnection line LIL1. The second active contact AC2 may be a bar-shaped pattern extending in the second direction D2.

When viewed in a plan view, the gate contact GC may be disposed between the first and second active regions PR and NR. In other words, the gate contact GC may be coupled to the gate electrode GE on the device isolation layer ST between the first and second active regions PR and NR.

The first metal layer M1 may be provided in the third interlayer insulating layer 130. The second metal layer M2 may be provided in the fourth interlayer insulating layer 140. The first and second metal layers M1 and M2 may be substantially the same as those in the previous embodiment described with reference to FIGS. 1, 2A to 2D, and 3.

In a semiconductor device according to an embodiment of the inventive concept, a via structure of an interconnection line may be a hybrid structure including a via portion and a barrier portion, which are used as a via plug and a barrier layer, respectively. Due to the via portion, it may be possible to reduce a via resistance of the interconnection line, and due to the barrier portion, it may be possible to impede/prevent a metal diffusion from occurring in a line structure of the interconnection line. As a result, it may be possible to improve electrical characteristics of the semiconductor device.

While example embodiments of the inventive concept have been particularly shown and described, it will be understood by one of ordinary skill in the art that variations in form and detail may be made therein without departing from the scope of the attached claims.

What is claimed is:

1. A semiconductor device comprising:
a substrate including an active pattern;
a plurality of channel patterns that are stacked on the active pattern and vertically spaced apart from each other;
a source/drain pattern on the active pattern, the source/drain pattern connected to the plurality of channel patterns;
a gate electrode on the plurality of channel patterns;
an active contact electrically connected to the source/drain pattern;
a first metal layer including a lower interconnection line electrically connected to the active contact;
a second metal layer on the first metal layer, the second metal layer including an upper interconnection line electrically connected to the lower interconnection line; and
wherein the upper interconnection line comprises:
a via structure in a via hole; and
a line structure in a line trench,
wherein the via structure comprises:
a via portion that is in the via hole and is coupled to the lower interconnection line; and
a barrier portion that vertically extends from the via portion to cover an inner surface of the line trench,
wherein the barrier portion is between the line structure and an interlayer insulating layer of the second metal layer, and
wherein the via portion and the barrier portion comprise the same metal and are integrated together as a single object.

2. The semiconductor device of claim 1, further comprising an etch stop layer between the first metal layer and the second metal layer,
wherein the via portion penetrates the etch stop layer.

3. The semiconductor device of claim 1,
wherein the barrier portion has a first thickness at its upper level, and
wherein the barrier portion has a second thickness that is substantially the same with or larger than the first thickness, at a level adjacent to the via portion.

4. The semiconductor device of claim 1, wherein a nitrogen concentration of the barrier portion is higher than a nitrogen concentration of the via portion.

5. The semiconductor device of claim 4, wherein the nitrogen concentration of the barrier portion ranges from 1 at % to 20 at %.

6. The semiconductor device of claim 1, wherein the via structure further comprises a protruding portion vertically protruding from the via portion toward the line structure.

7. The semiconductor device of claim 6, wherein a highest point of the protruding portion is located at a level higher than a bottom surface of the line trench and higher than a lower portion of the barrier portion.

8. The semiconductor device of claim 1,
wherein the line structure comprises a first conductive layer and a second conductive layer on the first conductive layer, and
wherein the first conductive layer is between the second conductive layer and the barrier portion.

9. The semiconductor device of claim 1,
wherein the via structure comprises molybdenum (Mo), ruthenium (Ru), tungsten (W), cobalt (Co), or a binary metal combination thereof, and
wherein the line structure comprises a metallic material that comprises copper (Cu), cobalt (Co), ruthenium (Ru), tungsten (W), molybdenum (Mo), aluminum (Al), silver (Ag), or gold (Au), and that is different from a material of the via structure.

10. The semiconductor device of claim 1, wherein at least a portion of the line structure extends into the via hole.

11. A semiconductor device comprising:
a transistor on a substrate;
a first metal layer on the transistor, the first metal layer comprising a lower interconnection line electrically connected to the transistor; and
a second metal layer on the first metal layer,
wherein the second metal layer comprises an upper interconnection line electrically connected to the lower interconnection line,
wherein the upper interconnection line comprises:
a via structure in a via hole; and
a line structure in a line trench,
wherein the via structure comprises:
a via portion that is in the via hole and is coupled to the lower interconnection line; and
a barrier portion that vertically extends from the via portion to cover an inner surface of the line trench,
wherein the barrier portion is between the line structure and an interlayer insulating layer of the second metal layer,
wherein the barrier portion has a first thickness at its upper level, and
wherein the barrier portion has a second thickness that is substantially the same with the first thickness, at a level adjacent to the via portion.

12. The semiconductor device of claim 11, wherein the via portion and the barrier portion comprise the same metal and are integrated together as a single object.

13. The semiconductor device of claim 11, wherein a nitrogen concentration of the barrier portion is higher than a nitrogen concentration of the via portion.

14. The semiconductor device of claim 13, wherein the nitrogen concentration of the barrier portion ranges from 1 at % to 20 at %.

15. The semiconductor device of claim 11, wherein the via structure further comprises a protruding portion vertically protruding from the via portion toward the line structure.

16. A semiconductor device comprising:
transistors on a substrate;
a first metal layer on the transistors, the first metal layer comprising a first lower interconnection line and a second lower interconnection line that are electrically connected to the transistors; and
a second metal layer on the first metal layer,
wherein the second metal layer comprises an upper interconnection line electrically connected to the first lower interconnection line and a super via electrically connected to the second lower interconnection line,
wherein the upper interconnection line comprises:
a via structure in a via hole, the via structure being coupled to the first lower interconnection line; and
a line structure in a line trench,
wherein the super via extends from a top surface of an interlayer insulating layer of the second metal layer to a top surface of the second lower interconnection line, and
wherein the super via comprises the same metal as the via structure.

17. The semiconductor device of claim 16, wherein a diameter of the super via is smaller than a diameter of the via structure.

18. The semiconductor device of claim 16,
wherein the via structure comprises:
a via portion that is in the via hole and is coupled to the first lower interconnection line; and
a barrier portion that vertically extends from the via portion to cover an inner surface of the line trench,
wherein the barrier portion is between the line structure and the interlayer insulating layer of the second metal layer.

19. The semiconductor device of claim 18, wherein the via portion and the barrier portion comprise the same metal and are integrated together as a single object.

20. The semiconductor device of claim 16,
wherein a bottom surface of the super via is located at the same level as a bottom surface of the via structure, and
wherein a top surface of the super via is located at the same level as a top surface of the line structure.

* * * * *